United States Patent
Shimanouchi et al.

(10) Patent No.: US 9,221,672 B2
(45) Date of Patent: Dec. 29, 2015

(54) ELECTRONIC DEVICE, METHOD OF MANUFACTURING THE ELECTRONIC DEVICE, AND METHOD OF DRIVING THE ELECTRONIC DEVICE

(71) Applicant: FUJITSU LIMITED, Kawasaki-shi, Kanagawa (JP)

(72) Inventors: Takeaki Shimanouchi, Akashi (JP); Osamu Toyoda, Akashi (JP); Satoshi Ueda, Kakogawa (JP)

(73) Assignee: FUJITSU LIMITED, Kawasaki (JP)

( * ) Notice: Subject to any disclaimer, the term of this patent is extended or adjusted under 35 U.S.C. 154(b) by 12 days.

(21) Appl. No.: 13/968,809

(22) Filed: Aug. 16, 2013

(65) Prior Publication Data
US 2013/0335122 A1    Dec. 19, 2013

Related U.S. Application Data

(63) Continuation of application No. PCT/JP2011/062716, filed on Jun. 2, 2011.

(51) Int. Cl.
*H01H 51/22* (2006.01)
*B81B 3/00* (2006.01)
*H01H 59/00* (2006.01)
*B81C 1/00* (2006.01)

(52) U.S. Cl.
CPC ........... *B81B 3/0018* (2013.01); *B81C 1/00134* (2013.01); *H01H 59/0009* (2013.01)

(58) Field of Classification Search
CPC ................................................ H01H 59/0009
USPC .......................................................... 335/78
See application file for complete search history.

(56) References Cited

U.S. PATENT DOCUMENTS 6,218,911 B1    4/2001  Kong
6,229,684 B1 *  5/2001  Cowen et al. ................. 361/278

(Continued)

FOREIGN PATENT DOCUMENTS

CN    1929067 A    3/2007
JP    H10-327037   12/1998

(Continued)

OTHER PUBLICATIONS

International Search Report for International Application No. PCT/JP2011/062716 dated Jul. 26, 2011.

(Continued)

*Primary Examiner* — Alexander Talpalatski
(74) *Attorney, Agent, or Firm* — Kratz, Quintos & Hanson, LLP

(57) ABSTRACT

An electronic device includes: a base member; a conductive film including a first end portion and a second end portion fixed to the base member, the conductive film being movable in a lateral direction of the base member between the first end portion and the second end portion; a first driving electrode, which is provided in the base member at a position opposed to a first main surface of the conductive film, and to which a first driving voltage is applied; a second driving electrode, which is provided in the base member at a position opposed to a second main surface of the conductive film, and to which a second driving voltage is applied; and a terminal provided in the base member at a position where the terminal enables to come into contact with the second main surface of the conductive film.

19 Claims, 30 Drawing Sheets

(56) References Cited

U.S. PATENT DOCUMENTS

| | | | |
|---|---|---|---|
| 6,236,491 B1* | 5/2001 | Goodwin-Johansson | 359/291 |
| 6,307,452 B1* | 10/2001 | Sun | 333/262 |
| 6,720,851 B2* | 4/2004 | Hallbjorner et al. | 335/78 |
| 7,027,284 B2* | 4/2006 | Kobayashi et al. | 361/278 |
| 7,405,635 B2 | 7/2008 | Hashimura | |
| 7,463,125 B2* | 12/2008 | Sridhar et al. | 335/78 |
| 7,477,884 B2* | 1/2009 | Choi et al. | 455/252.1 |
| 7,960,804 B1* | 6/2011 | Ebel et al. | 257/415 |
| 7,977,137 B1* | 7/2011 | Ebel et al. | 438/53 |
| 8,363,380 B2* | 1/2013 | Lan et al. | 361/281 |
| 8,810,341 B2* | 8/2014 | Bachman et al. | 335/78 |
| 8,901,709 B2* | 12/2014 | Shimanouchi et al. | 257/532 |
| 2002/0018334 A1* | 2/2002 | Hill et al. | 361/278 |
| 2002/0055260 A1* | 5/2002 | Chow et al. | 438/689 |
| 2003/0059973 A1* | 3/2003 | Trainor | 438/52 |
| 2003/0067047 A1* | 4/2003 | Sandoe et al. | 257/415 |
| 2003/0155221 A1* | 8/2003 | Kawai | 200/43.01 |
| 2004/0124945 A1 | 7/2004 | Nakanishi | |
| 2005/0104693 A1* | 5/2005 | Youngner | 335/78 |
| 2005/0270128 A1 | 12/2005 | Nakanishi | |
| 2006/0087390 A1 | 4/2006 | Yuba | |
| 2006/0226501 A1* | 10/2006 | Allen Chou | 257/415 |
| 2006/0290443 A1* | 12/2006 | Chou et al. | 333/105 |
| 2007/0146095 A1* | 6/2007 | Chou et al. | 333/105 |
| 2007/0256917 A1* | 11/2007 | Oberhammer et al. | 200/181 |
| 2013/0213778 A1* | 8/2013 | Davidson et al. | 200/181 |
| 2014/0262707 A1* | 9/2014 | Pawashe et al. | 200/181 |

FOREIGN PATENT DOCUMENTS

| | | |
|---|---|---|
| JP | 2001-84884 A1 | 3/2001 |
| JP | 2004-111360 A1 | 4/2004 |
| JP | 2005-209625 A1 | 8/2005 |
| JP | 2006-120449 A1 | 5/2006 |
| JP | 2008-41589 A1 | 2/2008 |
| JP | 2008-59865 A1 | 3/2008 |
| JP | 2010-225810 A1 | 10/2010 |

OTHER PUBLICATIONS

Office Action of China Patent Application No. 201180069268.5 dated Jan. 23, 2015. Full Translation of Office Action.

* cited by examiner

ELECTRONIC DEVICE, METHOD OF MANUFACTURING THE ELECTRONIC DEVICE, AND METHOD OF DRIVING THE ELECTRONIC DEVICE

CROSS-REFERENCE TO RELATED APPLICATION

This application is a continuation of International Patent Application No. PCT/JP2011/062716 filed Jun. 2, 2011 and designated the U.S., the entire contents of which are incorporated herein by reference.

FIELD

The embodiments discussed herein are related to an electronic device, a method of manufacturing the electronic device, and a method of driving the electronic device.

BACKGROUND

MEMS (Micro Electro Mechanical Systems) technology has been increasingly adopted in order to achieve miniaturization of electronic devices to be mounted on electronic appliances such as mobile phones. Examples of the electronic devices produced by the MEMS technology include switch devices, micromirror devices, acceleration sensors, and the like.

It is preferable to improve the reliability of these electronic devices by appropriately controlling the movement of movable sections such as beams.

PATENT DOCUMENT 1: Japanese Laid-open Patent Publication No. 2010-225810
PATENT DOCUMENT 2: Japanese Laid-open Patent Publication No. 10-327037

SUMMARY

According to a first aspect of the following disclosure, there is provided an electronic device including: a base member; a conductive film including a first end portion and a second end portion fixed to the base member, the conductive film being movable in a lateral direction of the base member between the first end portion and the second end portion; a first driving electrode, which is provided in the base member at a position opposed to a first main surface of the conductive film, and to which a first driving voltage is applied; a second driving electrode, which is provided in the base member at a position opposed to a second main surface of the conductive film, and to which a second driving voltage is applied; and a terminal provided in the base member at a position where the terminal enables to come into contact with the second main surface of the conductive film.

Moreover, according to another aspect of the disclosure, there is provided a method of manufacturing an electronic device, the method including: forming a conductive film including a first end portion and a second end portion fixed to a base member, the conductive film being movable in a lateral direction of the base member between the first end portion and the second end portion; forming a first driving electrode in the base member at a position opposed to a first main surface of the conductive film, a first driving voltage being applied to the first driving electrode; forming a second driving electrode in the base member at a position opposed to a second main surface of the conductive film, a second driving voltage being applied to the second driving electrode; and forming a terminal in the base member at a position where the terminal enables to come into contact with the second main surface of the conductive film.

Further, accordingly to still another aspect of the disclosure, there is provided a method of driving an electronic device, the device including: a base member; a conductive film including a first end portion and a second end portion fixed to the base member, the conductive film being movable in a lateral direction of the base member between the first end portion and the second end portion; a first driving electrode provided in the base member at a position opposed to a first main surface of the conductive film; a second driving electrode provided in the base member at a position opposed to a second main surface of the conductive film; and a terminal provided in the base member at a position where the terminal enables to come into contact with the second main surface of the conductive film, the method including: applying a first driving voltage to the first driving electrode to attract the conductive film to the first driving electrode side and thereby separate the conductive film from the terminal; and applying a second driving voltage to the second driving electrode to attract the conductive film to the second driving electrode side and thereby connect the terminal and the conductive film to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before the present embodiments are described, description will be given of a prelude which serves as the basis of the present embodiments.

Figure 1:
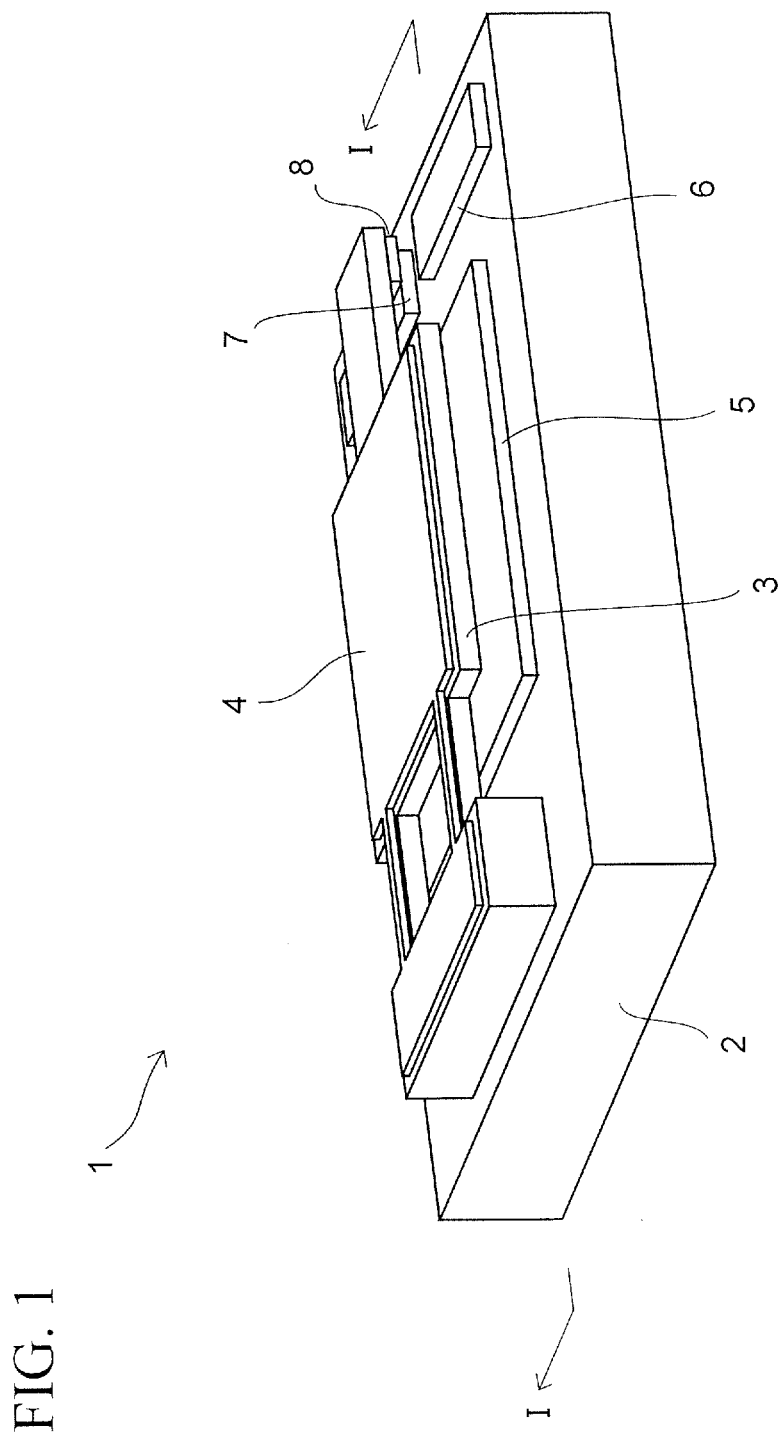
FIG. 1 is a perspective view of an electronic device according to a prelude.

FIG. 1 is a perspective view of an electronic device according to the prelude.

This electronic device 1 is a switch device produced by the MEMS technology, and includes a beam 3, an upper driving electrode 4, a lower driving electrode 5, an input electrode 6, and an output electrode 7 on a base member 2.

Among them, the beam 3 is elastically deformable, and a terminal 8 is provided at a tip end of the beam 3. The terminal 8 is used as a contact of the switch device. When the beam 3 is bent toward the base member 2, the terminal 8 comes into contact with each of the input electrode 6 and the output electrode 7.

Moreover, the input electrode 6 is supplied with an RF (Radio Frequency) signal used for switching. When the switch is in an on-state, the RF signal is outputted from the output electrode 7.

Note that gold having a low electrical resistance in comparison with other metals is used as the material of the input electrode 6, the output electrode 7, and the terminal 8.

Figure 2:
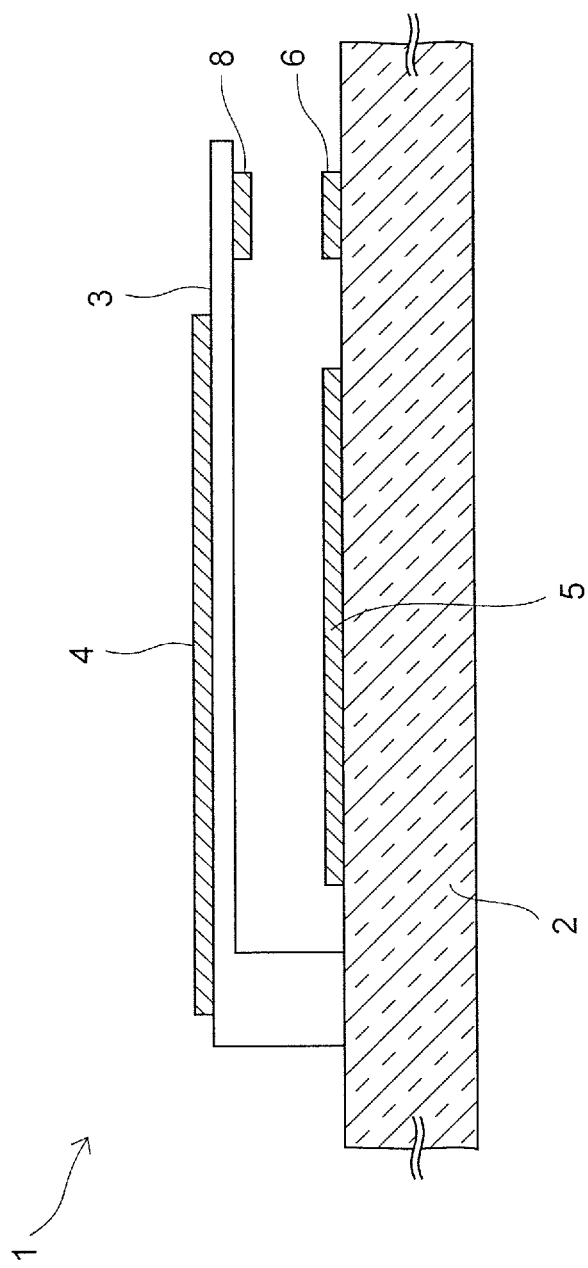
FIG. 2 is a cross-sectional view taken along the line I-I in FIG. 1.

FIG. 2 is a cross-sectional view taken along the line I-I in FIG. 1.

As illustrated in FIG. 2, one end of the beam 3 is supported on the base member 2. Such a beam 3 is also called a cantilever.

Figure 3:
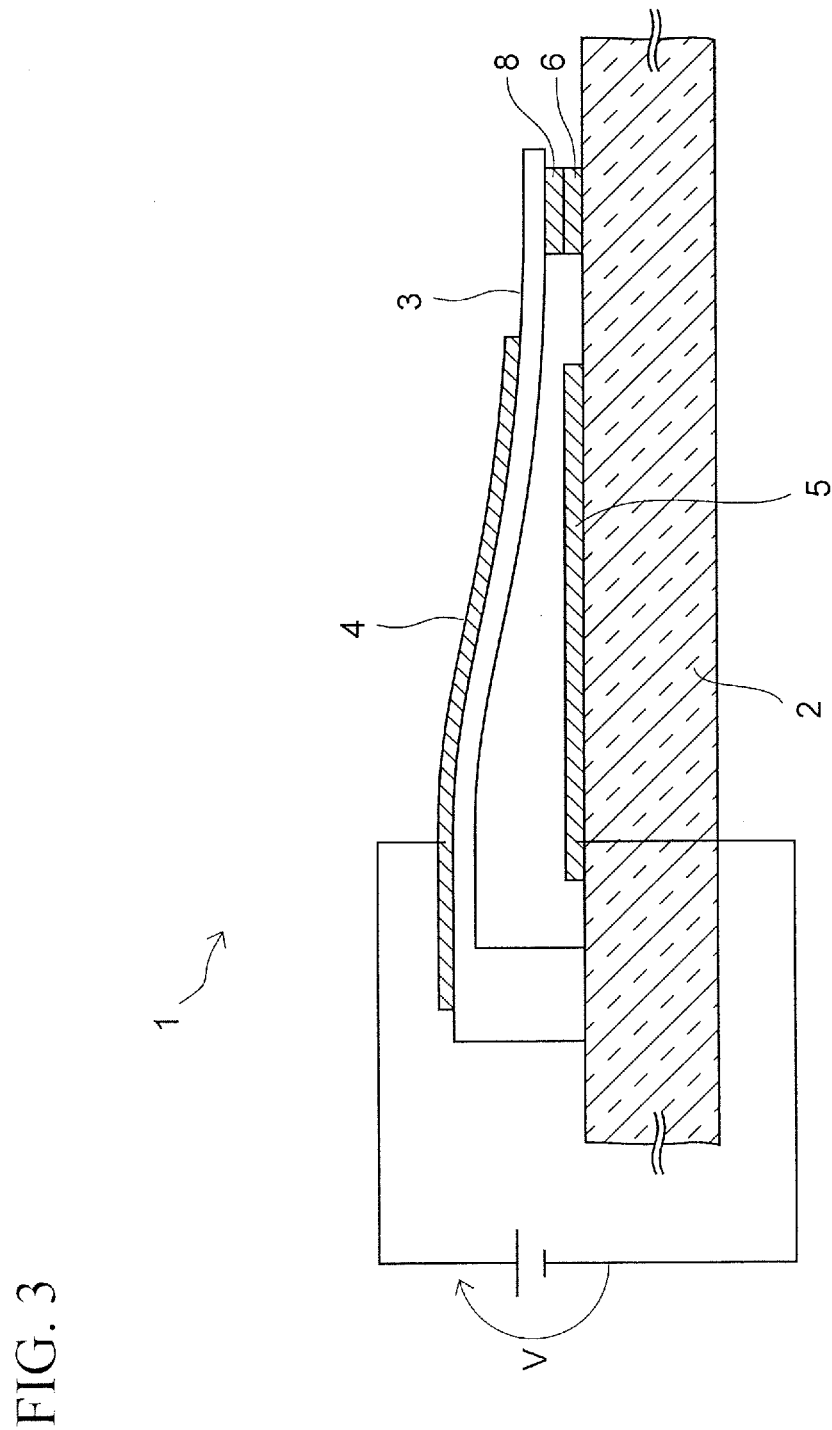
FIG. 3 is a cross-sectional view of the electronic device according to the prelude when the switch is in an on-state.

FIG. 3 is a cross-sectional view of the electronic device 1 when the switch is in an on-state.

As illustrated in FIG. 3, in order to turn on the switch, a drive voltage V is applied between the upper driving electrode 4 and the lower driving electrode 5, and an electrostatic attractive force is generated between the upper driving electrode 4 and the lower driving electrode 5. Thereby, the beam 3 is bent toward the base member 2, and the terminal 8 comes into contact with each of the input electrode 6 and the output terminal 7 (see FIG. 1). Thus, the input terminal 6 and the output terminal 7 are electrically connected to each other via the terminal 8.

Note that, in order to turn off the switch, the terminal 8 is separated from each of the input electrode 6 and the output electrode 7 by stopping the application of the drive voltage V, so that the beam 3 returns to the original state by its own elastic force.

On the other hand, when the switch is turned on as described above, the contact resistance between the terminal 8 and each of the electrodes 6 and 7 is preferably reduced as much as possible so as to prevent a loss of the RF signal flowing through the input electrode 6 and the output electrode 7.

An example of such a method for reducing the contact resistance includes a method in which the beam 3 is strongly attracted toward the base member 2 by increasing the drive voltage V.

It should be noted however that in the on-state as described above, when the drive voltage V is high, even if the application of the drive voltage V is stopped, the terminal 8 stays attached to each of the electrodes 6 and 7. Hence, the switch is not always turned off. Such a phenomenon in which the terminal 8 stays attached is called sticking, and serves as a factor of reducing the reliability of the electronic device 1.

Particularly, since gold used as the material of the input electrode 6, the output electrode 7, and the terminal 8 is soft, the material is likely to adhere to other metal materials, assisting the above-described sticking.

Further, even if such sticking does not occur, when the RF signal inputted to the input electrode 6 is superimposed on a carrier wave having a low frequency of approximately several Hz, an electrostatic attractive force is generated between the terminal 8 and the input electrode 6 by the peak voltage of the carrier wave. In this case also, this electrostatic attractive force causes the terminal 8 and the input electrode 6 to come into contact with each other, and may prevent the switch from being turned off.

In view of the above-described knowledges, the inventor of the present application has arrived at the present embodiments as described hereinbelow.

(First Embodiment)

Figure 4:
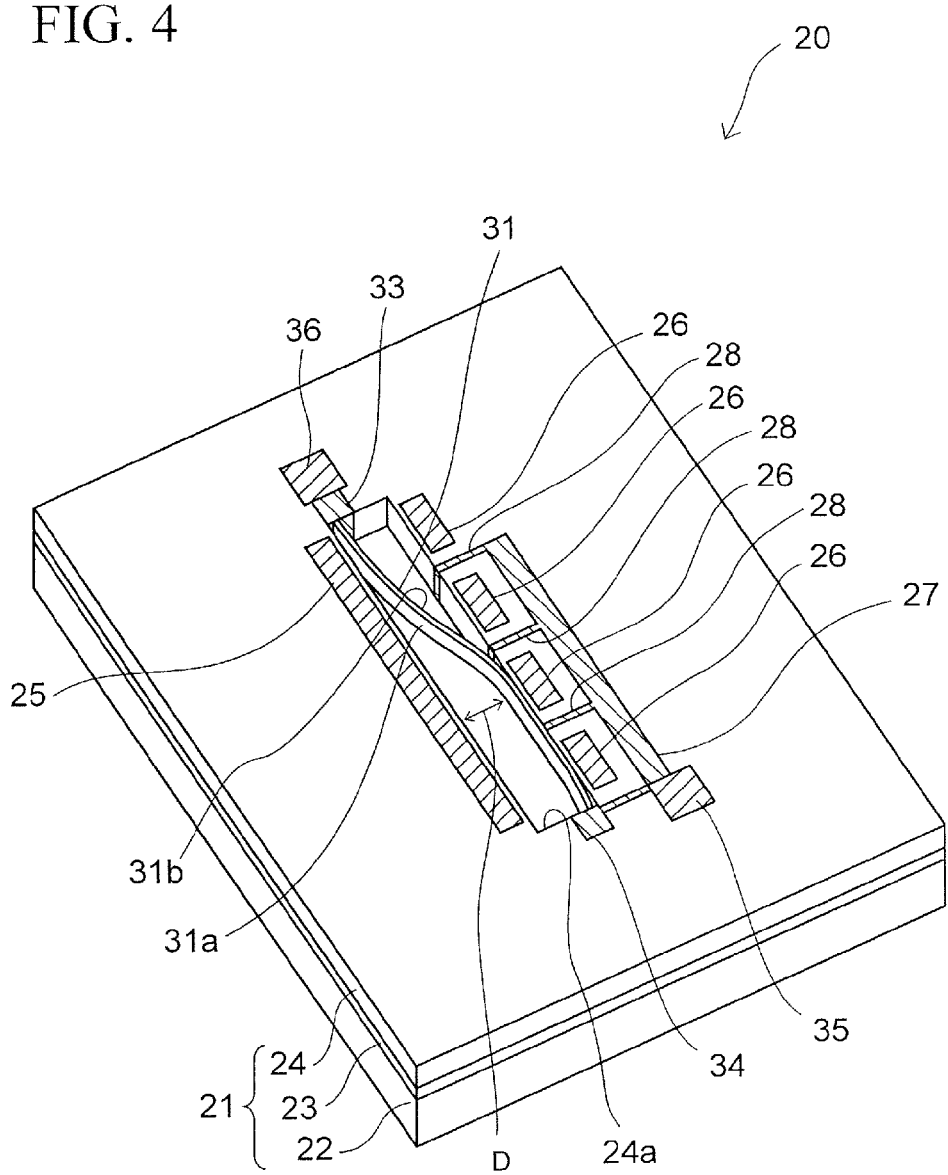
FIG. 4 is a perspective view of an electronic device according to a first embodiment.

FIG. 4 is a perspective view of an electronic device 20 according to the present embodiment.

This electronic device 20 has a base member 21 and a conductive film 31.

Among them, the base member 21 is an SOI (Silicon On Insulator) substrate, in which a silicon oxide film 23 and a silicon film 24 are formed in this order on a silicon substrate 22. A groove 24a is formed in the surface of the base member 21.

The groove 24a has a rectangular shape in a plan view thereof, and the conductive film 31 is provided inside the groove 24a. The conductive film 31 is provided in such a manner as to extend in a longitudinal direction of the groove 24a, and fixed to the base member 21 via a first end portion 33 and a second end portion 34.

Moreover, since a first main surface 31a and a second main surface 31b of the conductive film 31 face in a lateral direction D of the base member 21, the conductive film 31 is movable in the lateral direction D.

Further, in a portion at a side of the groove 24a and opposed to the first main surface 31a, a first driving electrode 25 is provided apart from the groove 24a. The shape of the first driving electrode 25 in a plan view thereof is a rectangular shape long in the longitudinal direction of the groove 24a.

In addition, in portions at a side of the groove 24a and opposed to the second main surface 31b, a plurality of second driving electrodes 26 and terminals 28 are provided. Among them, the terminals 28 are exposed on a side surface of the groove 24a, and may enable to come into contact with the conductive film 31.

In the present embodiment, the plurality of terminals 28 are electrically connected to each other through a conductive pattern 27.

Meanwhile, the plurality of second driving electrodes 26 are provided apart from the groove 24a, and the shape in a plan view thereof is a rectangular shape long in the longitudinal direction of the groove 24a.

Further, a first electrode pad 35 is provided on the conductive pattern 27, and a second electrode pad 36 is electrically connected to the first end portion 33 of the conductive film 31. The material of the first electrode pad 35 and the second electrode pad 36 is not particularly limited. In the present embodiment, a gold film is patterned to form the first electrode pad 35 and the second electrode pad 36.

Figure 5:
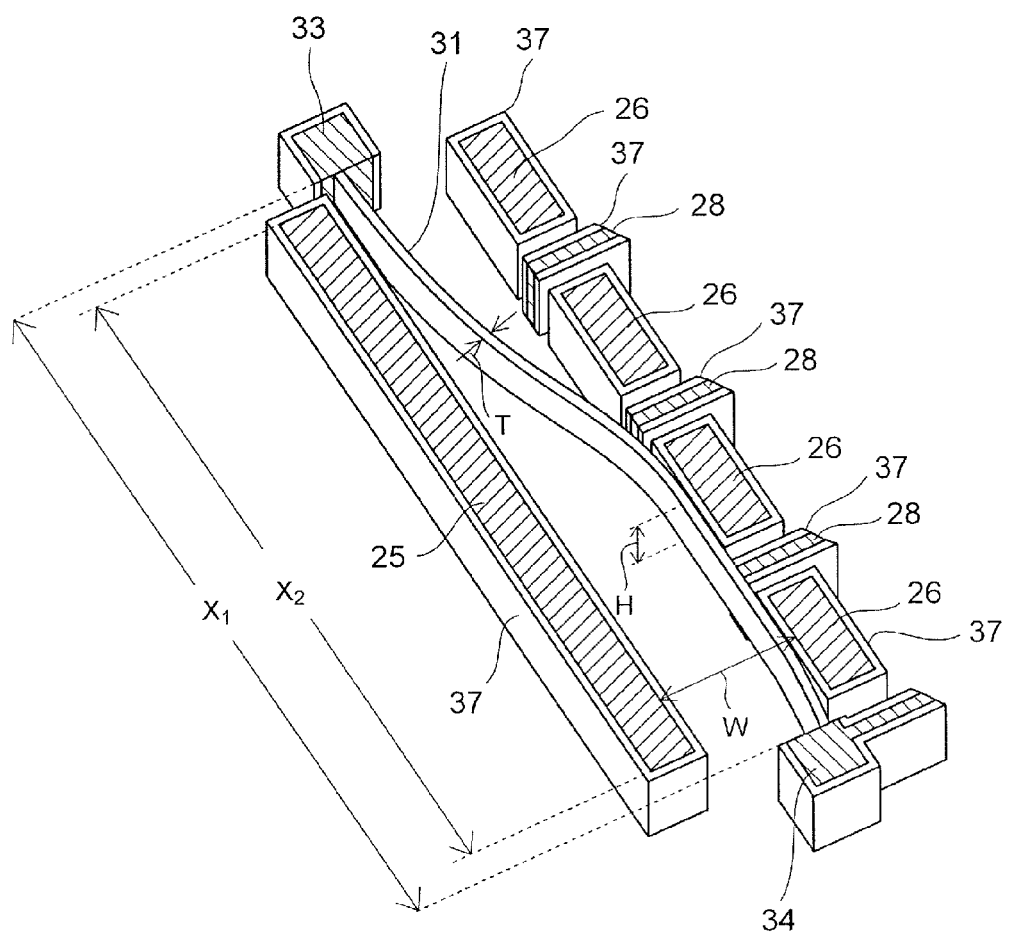
FIG. 5 is an enlarged perspective view of a conductive film of the electronic device according to the first embodiment and surrounding of the conductive film.

FIG. 5 is an enlarged perspective view of the conductive film 31 and its surroundings.

The size of the conductive film 31 is not particularly limited. In the present embodiment, the conductive film 31 has a thickness T of approximately 2 μm to 3 μm, and the conductive film 31 has a length $X_1$ of approximately 500 μm to 1000 μm. Moreover, the conductive film 31 has a height H of approximately around 25 μm.

Moreover, the first driving electrode 25 has a length $X_2$ of approximately 500 μm in its longitudinal direction. An interval W between the first driving electrode 25 and the second driving electrode 26 is approximately 20 μm.

A side periphery of each of the first driving electrode 25 and the second driving electrodes 26 is covered with a dielectric film 37 such as a silicon nitride film. The dielectric film 37 may be capable of preventing electrical short-circuit between the conductive film 31 and the first driving electrode 25 or the second driving electrodes 26.

On the other hand, tip ends of the terminals 28 are not covered with the dielectric film 37, and may enable to come into contact with the conductive film 31. Moreover, one of the plurality of terminals 28 is provided between corresponding two of the plurality of second driving electrodes 26.

Figure 6:
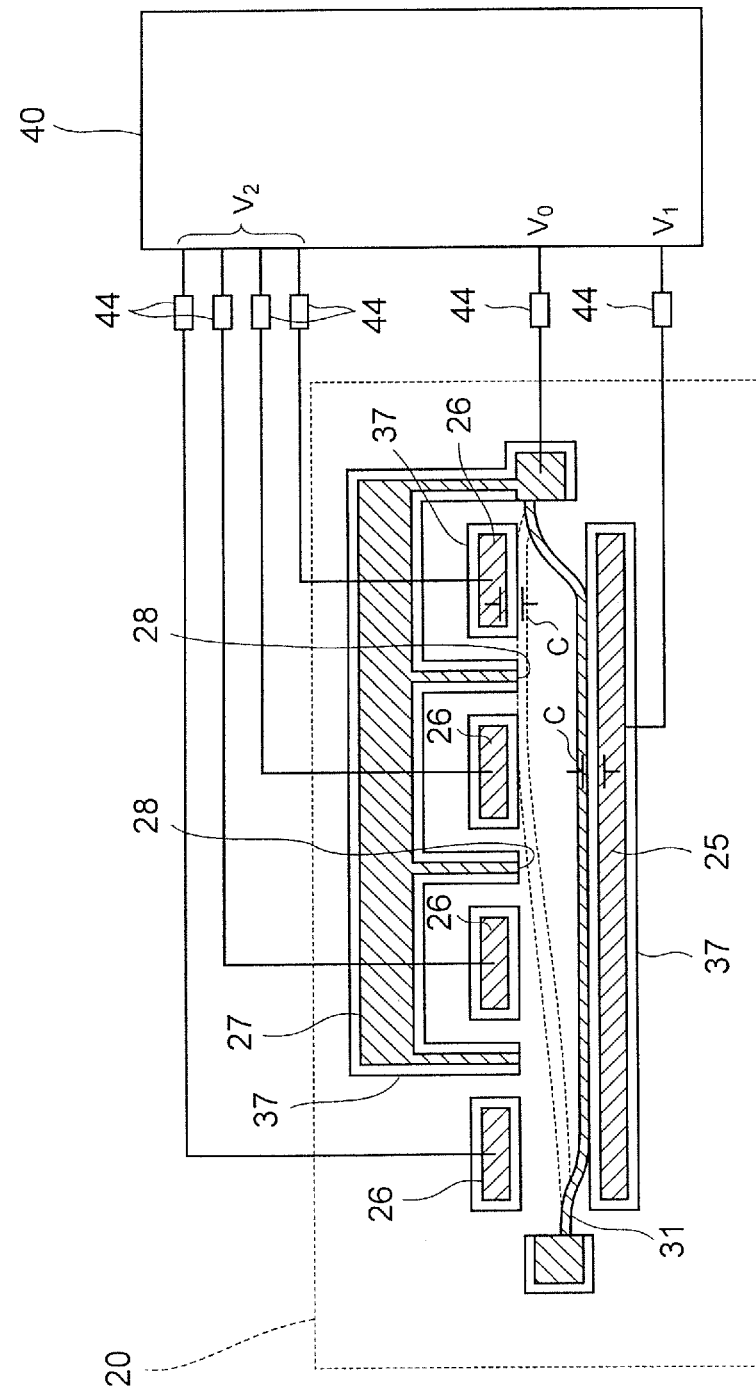
FIG. 6 is a schematic view of the electronic device according to the first embodiment and a driver IC for driving the electronic device.

FIG. 6 is a schematic view of the electronic device 20 and a driver IC 40 for driving the same.

The driver IC 40 is used as a voltage supply unit configured to output a first driving voltage $V_1$ to the first driving electrode 25 and selectively output a second driving voltage $V_2$ to each of the plurality of second driving electrodes 26. Moreover, the driver IC 40 is configured to maintain the conductive film 31 at a reference voltage $V_0$ all the time.

Furthermore, both of the first driving voltage $V_1$ and the second driving voltage $V_2$ described above are positive voltages higher than the reference voltage $V_0$. In the present embodiment, the reference voltage $V_0$ is a ground potential, and the voltage value of each of the first driving voltage $V_1$ and the second driving voltage $V_2$ is approximately 5 V to 20 V.

In this respect, since the conductive film 31 is movable as described above, when the conductive film 31 approaches to the first driving electrode 25 with the dielectric film 37 in between, a capacitor C is formed between the conductive film 31 and the first driving electrode 25. Such a capacitor C is also formed when the conductive film 31 approaches to the second driving electrode 26.

The capacitor C has a property of passing an alternating current component therethrough. Hence, there is a possibility that an alternating current component is transmitted from the electronic device 20 to the driver IC 40, causing noise.

In order to prevent such noise, in the present embodiment, a plurality of RF blocks 44 are provided between the electronic device 20 and the driver IC 40. The RF blocks 44 are resistive elements having a high resistance of approximately 10 kΩ, and have a function of preventing transmission of an alternating current component from the electronic device 20 to the driver IC 40.

In this electronic device 20, the driver IC 40 is used to change the mode of applying the first driving voltage $V_1$ or the second driving voltage $V_2$ described above. This may make it possible to bring the conductive film 31 into contact with any of the plurality of terminals 28 as follows.

Next, description will be given of a method of driving the electronic device 20.

Figure 7A:
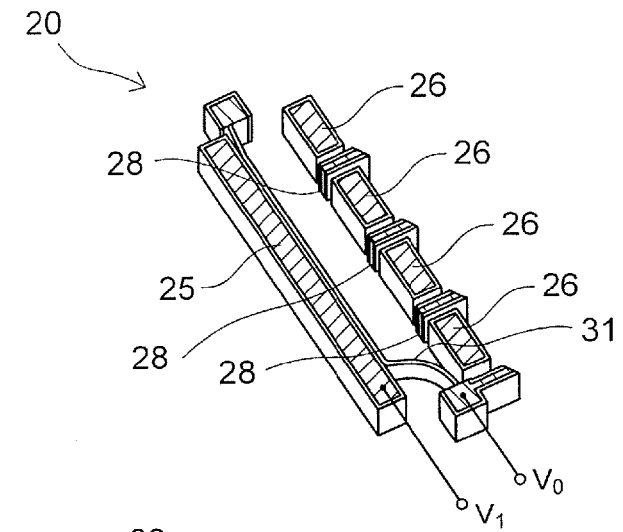
FIGS. 7A to 7C are schematic views for explaining a method of driving an electronic device according to the first embodiment.
Figure 7B:
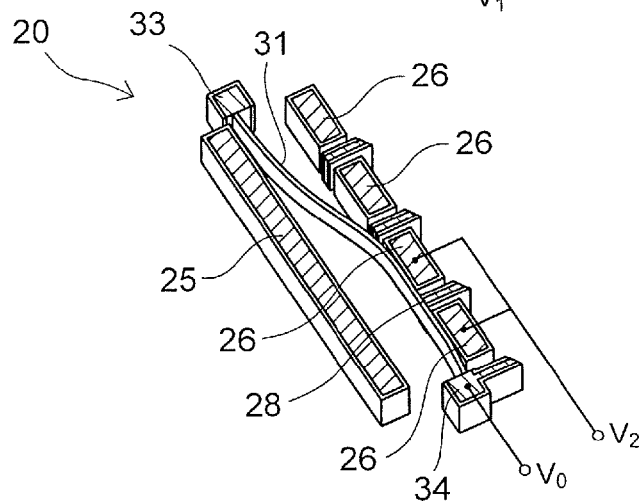
Figure 7C:
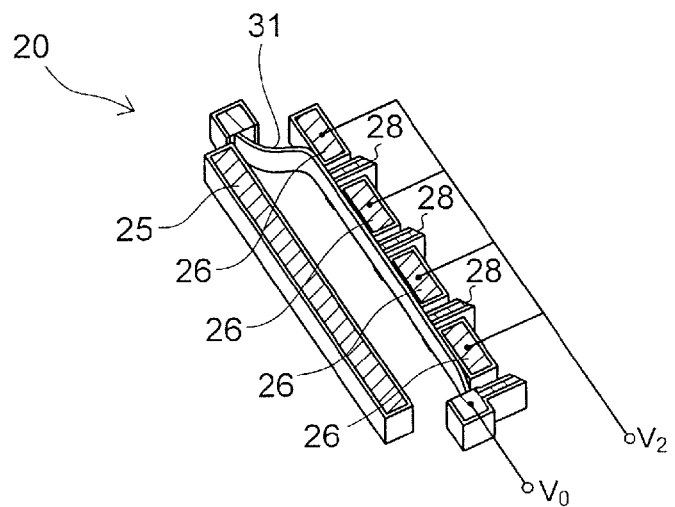

FIGS. 7A to 7C are schematic views for explaining the method of driving the electronic device 20.

FIG. 7A is a perspective view where the first driving voltage $V_1$ is applied to the first driving electrode 25. Note that, in this example, the second driving voltage $V_2$ is not applied to the second driving electrodes 26, and the potential of the second driving electrodes 26 is the same as the potential of the conductive film 31.

In this case, an electrostatic attractive force is generated between the first driving electrode 25 and the conductive film 31, but no electrostatic attractive force is generated between the second driving electrodes 26 and the conductive film 31, which have the same potential.

Accordingly, the conductive film 31 is attracted to the first driving electrode 25, and all of the terminals 28 are separated from the conductive film 31.

Meanwhile, FIG. 7B is a perspective view where the second driving voltage $V_2$ is applied to the two second driving electrodes 26 close to the second end portion 34. Note that, in this case, the first driving voltage $V_1$ is not applied to the first driving electrode 25, and the first driving electrode 25 has the same potential as the conductive film 31.

In this manner, no electrostatic attractive force is generated between the first driving electrode 25 and the conductive film 31, which have the same potential. On the other hand, an electrostatic attractive force is generated between the conductive film 31 and the two driving electrodes 26 to which the second driving voltage $V_2$ is applied. The terminal 28 between the two driving electrodes 26 is connected to the conductive film 31.

Further, FIG. 7C is a perspective view where the second driving voltage $V_2$ is applied to all of the driving electrodes 26. In this case also as in the case of FIG. 7B, the first driving voltage $V_1$ is not applied to the first driving electrode 25, and the first driving electrode 25 has the same potential as the conductive film 31.

In this manner, when the second driving voltage $V_2$ is applied to all of the second driving electrodes 26, the conductive film 31 is attracted to all of the second driving electrodes 26, and the conductive film 31 is connected to all of the plurality of terminals 28.

As described above, in the example in FIGS. 7A to 7C, it may be possible to bring the conductive film 31 into contact with any of the plurality of terminals 28. Thus, the electronic device 20 may be used as a switch device, in which the conductive film 31 is electrically connected to any of the plurality of terminals 28.

Moreover, when the conductive film 31 is not electrically connected to any of the plurality of terminals 28, the conductive film 31 is forced to be attracted to the first driving electrode 25 by the first driving voltage $V_1$ as illustrated in FIG. 7A.

Hence, unlike a case as in FIG. 3 where the terminal 8 is separated from the input electrode 6 by utilizing the elastic force of the beam 3, the conductive film 31 does not stay attached to the terminals 28 due to sticking.

This aspect is particularly useful in a case where the conductive film 31 is strongly attracted to the terminals 28 by increasing the second driving voltage $V_2$ so as to reduce the contact resistance between the terminals 28 and the conductive film 31.

Furthermore, suppose a case where an RF signal superimposed on a carrier wave having a low frequency of approximately several Hz flows through the conductive film 31, so that the peak voltage of the carrier wave causes an electrostatic attractive force to be generated between the conductive film 31 and the second driving electrodes 26. In this case also, the conductive film 31 may be attracted to the first driving electrode 25 side.

From these, the present embodiment may make it possible to separate the terminals 28 and the conductive film 31 from each other, and consequently to improve the reliability of the electronic device 20.

In the above description, the electronic device 20 is used as a switch device. Nevertheless, the electronic device 20 may also be used as a variable inductor as follows.

Figure 8A:
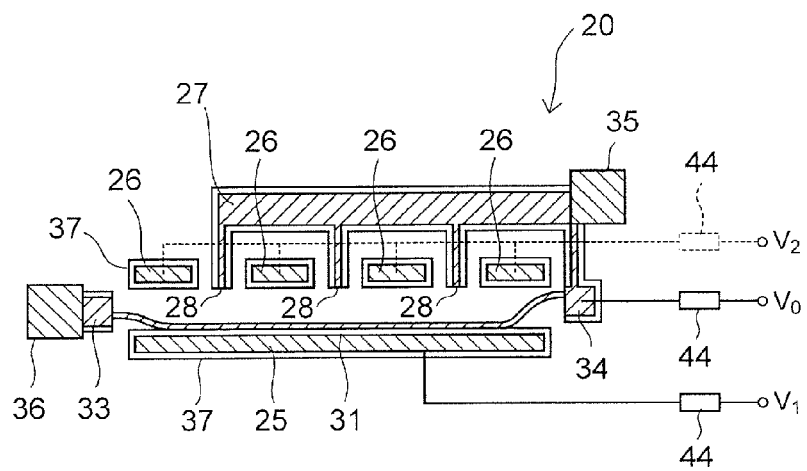
FIG. 8A is a schematic view (Part 1) of the electronic device according to the first embodiment.
Figure 8B:
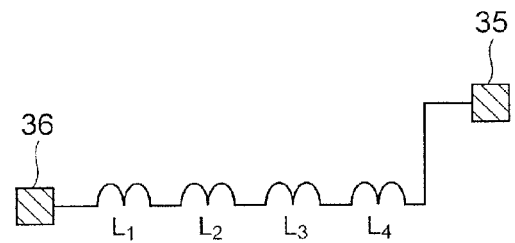
FIG. 8B is an equivalent circuit diagram thereof.

FIG. 8A is a schematic view (Part 1) of the electronic device 20, and FIG. 8B is an equivalent circuit diagram thereof.

The example in FIG. 8A illustrates a state where the conductive film 31 is attracted to the first driving electrode 25 by the first driving voltage $V_1$.

In this case, the conductive film 31 is separated from all of the terminals 28. Suppose that the conductive film 31 is regard as first to fourth inductance components $L_1$ to $L_4$ connected in series as illustrated in FIG. 8B. This case is equivalent to one where the first to fourth inductance components $L_1$ to $L_4$ are connected in series between the first electrode pad 35 and the second electrode pad 36.

Figure 9A:
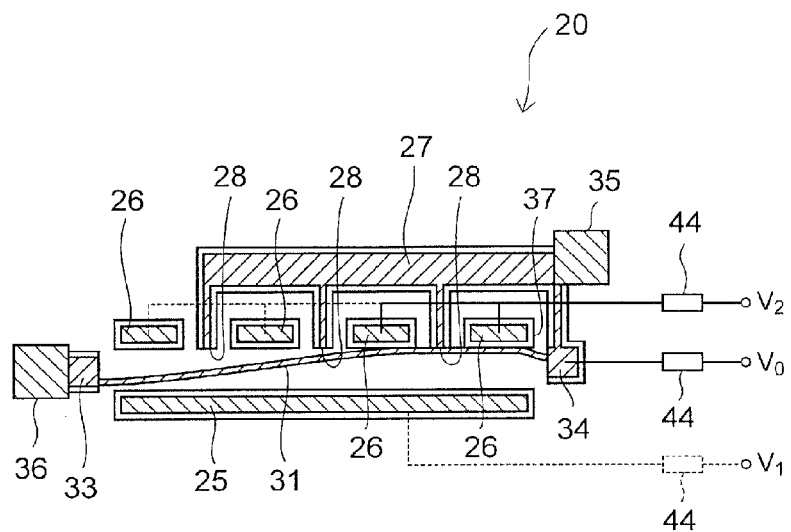
FIG. 9A is a schematic view (Part 2) of the electronic device according to the first embodiment.
Figure 9B:
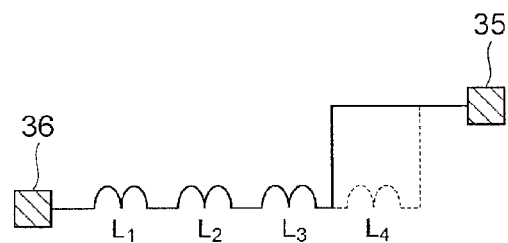
FIG. 9B is an equivalent circuit diagram thereof.

FIG. 9A is a schematic view (Part 2) of the electronic device 20, and FIG. 9B is an equivalent circuit diagram thereof.

In this case, the second driving voltage $V_2$ is applied to the two second driving electrodes 26 close to the second end portion 34, and the conductive film 31 is brought into contact with the terminal 28 between these second driving electrodes 26.

In this manner, a portion of the conductive film 31 close to the second end portion 34 is bypassed by the conductive pattern 27. Hence, as illustrated in FIG. 9B, the fourth inductance component $L_4$ is eliminated between the first electrode pad 35 and the second electrode pad 36. Thus, the inductance components of the circuit may be reduced in comparison with the case of FIG. 8A.

Figure 10A:
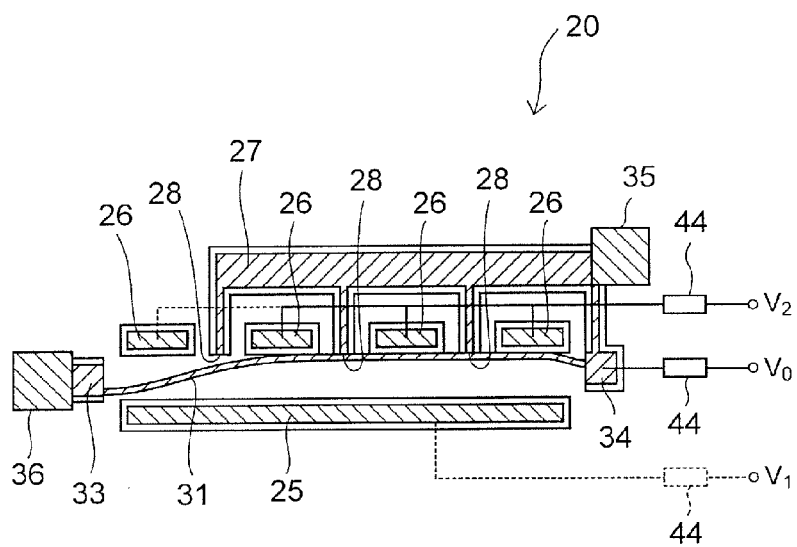
FIG. 10A is a schematic view (Part 3) of the electronic device according to the first embodiment.
Figure 10B:
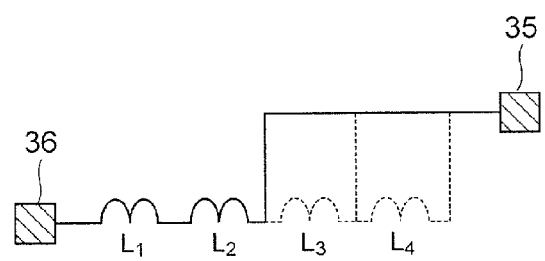
FIG. 10B is an equivalent circuit diagram thereof.

FIG. 10A is a schematic view (Part 3) of the electronic device 20, and FIG. 10B is an equivalent circuit diagram thereof.

In this case, the second driving voltage $V_2$ is applied to the three second driving electrodes 26 close to the second end portion 34, and the conductive film 31 is brought into contact with the terminals 28 between corresponding two of these second driving electrodes 26.

In this manner, the length of a portion of the conductive film 31 bypassed by the conductive pattern 27 is made longer than that in the case of FIG. 9A. Accordingly, as illustrated in FIG. 10B, the third inductance component $L_3$ and the fourth inductance component $L_4$ are eliminated between the first electrode pad 35 and the second electrode pad 36. Thus, the inductance components of the circuit may be reduced in comparison with the case of FIG. 9A.

Figure 11A:
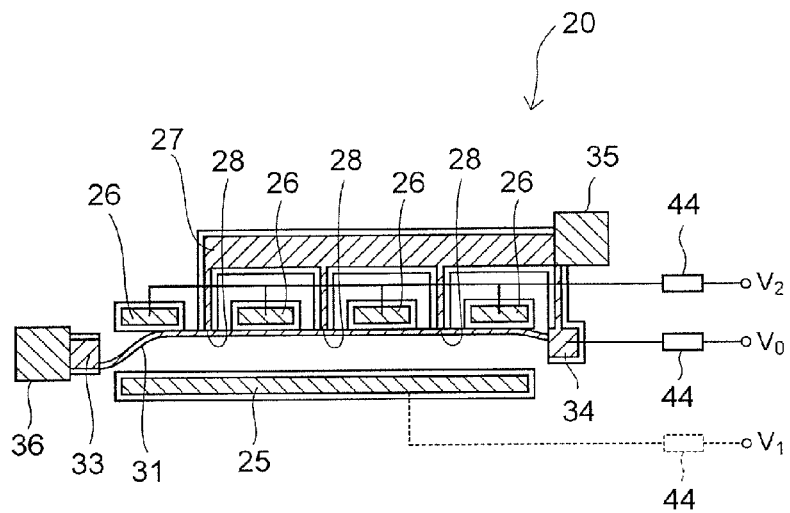
FIG. 11A is a schematic view (Part 4) of the electronic device according to the first embodiment.
Figure 11B:
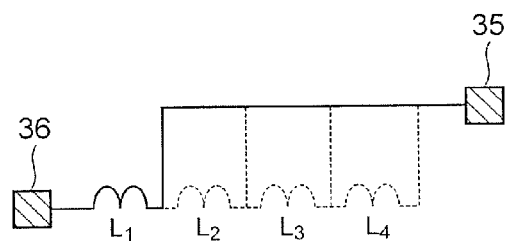
FIG. 11B is an equivalent circuit diagram thereof.

FIG. 11A is a schematic view (Part 4) of the electronic device 20, and FIG. 11B is an equivalent circuit diagram thereof.

In this case, the second driving voltage $V_2$ is applied to all of the second driving electrodes 26, and thereby the conductive film 31 is brought into contact with all of the terminals 28.

In this manner, the inductance components of the circuit is reduced smaller than that in the case of FIG. 10A. The second to the fourth inductance components $L_2$ to $L_4$ are eliminated between the first electrode pad 35 and the second electrode pad 36 as in FIG. 11B.

As described above, the electronic device 20 according to the present embodiment may make it possible to change the length of the portion of the conductive film 31 bypassed by the conductive pattern 27, by selecting which one or more of the plurality of second driving electrodes 26 the second driving voltage $V_2$ is applied to. This may enable stepwise adjustment of inductances in a circuit, and the electronic device 20 may be used as a variable inductor.

According to the electronic device 20, for example, an inductance may be adjusted within a range of approximately several Ω to 500 Ω.

The use of the electronic device 20 is not particularly limited.

Figure 12:
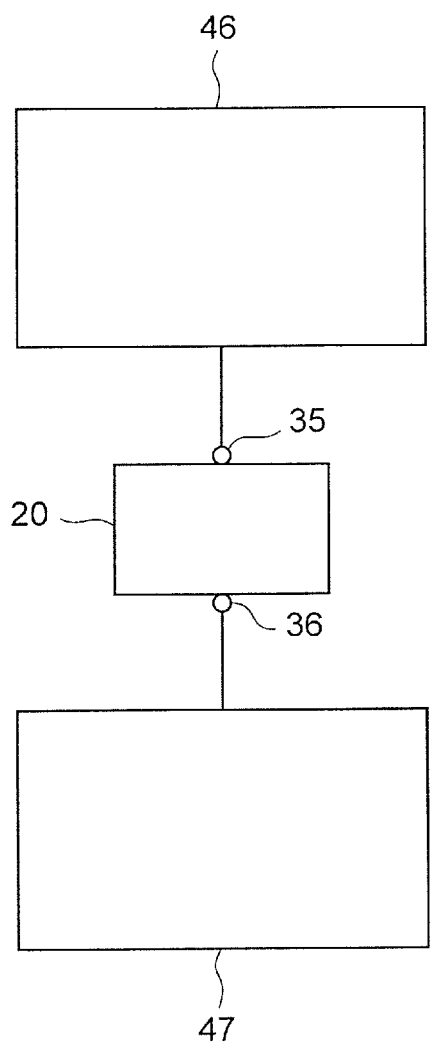
FIG. 12 is a schematic view illustrating one example of the use of the electronic device according to the first embodiment.

FIG. 12 is a schematic view illustrating one example of the use of the electronic device 20.

In the example illustrated in FIG. 12, the first electrode pad 35 of the electronic device 20 is electrically connected to a first high-frequency unit 46, and the second electrode pad 36 of the electronic device 20 is connected to a second high-frequency unit 47.

Then, the inductance of the electronic device 20 is adjusted as in FIGS. 8A, 8B, 9A, 9B, 10A, 10B, 11A and 11B described above in such a manner that the impedance of the first high-frequency unit 46 seen by the electronic device 20 becomes equal to the impedance of the second high-frequency unit 47 seen by the electronic device 20. This may enable the impedance matching between the first high-frequency unit 46 and the second high-frequency unit 47, and a loss of a high frequency signal between the high-frequency units 46 and 47 may be suppressed.

Incidentally, the frequency of a high frequency signal used for the impedance matching by the electronic device 20 is not particularly limited. However, a high frequency signal of approximately 700 MHz to 8 GHz widely available in the market is preferably used.

Next, description will be given of a method of manufacturing the electronic device 20 according to the present embodiment.

FIGS. 13A to 13H are cross-sectional views of the electronic device 20 in the course of manufacture thereof according to the present embodiment, and FIGS. 14 to 17 are plan views thereof.

Figure 13A:
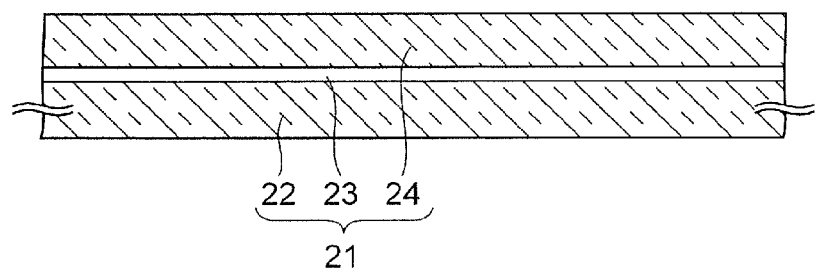
FIGS. 13A to 13H are cross-sectional views of the electronic device in the course of manufacture thereof according to the first embodiment.

First of all, as illustrated in FIG. 13A, an SOI substrate, in which the silicon oxide film 23 and the silicon film 24 are formed in this order on the silicon substrate 22, is prepared as the base member 21.

In the base member 21, the silicon substrate 22 has a thickness of approximately 525 μm, and the silicon oxide film 23 has a thickness of approximately 4 μm. Additionally, the silicon film 24 has a thickness of approximately 25 μm.

Figure 13B:
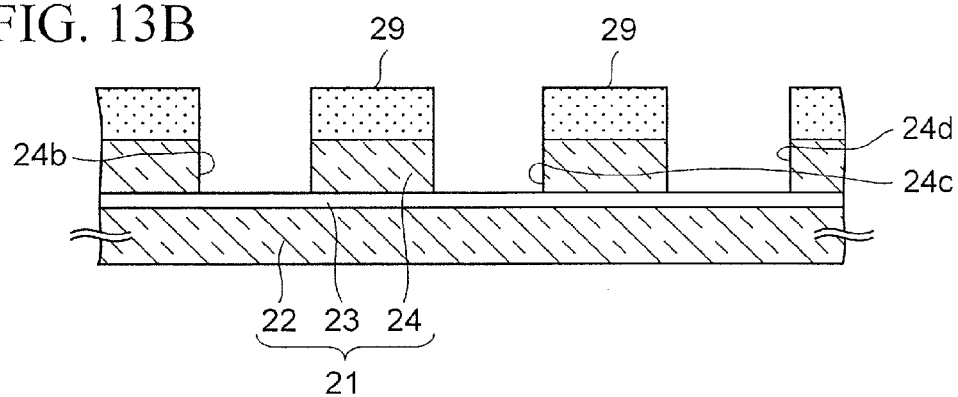

Next, as illustrated in FIG. 13B, a photoresist is applied to the entire upper surface of the base member 21, which then undergoes exposure and development. Thereby, a first resist pattern 29 is formed.

Subsequently, using the first resist pattern 29 as a mask, the silicon film 24 is etched by dry etching. Thereby, first to third recesses 24b to 24d are formed apart from each other in the base member 21.

As the dry etching, Deep-RIE capable of highly anisotropic etching is preferably employed. In the Deep-RIE, $SF_6$ and $C_4F_8$ are alternately supplied into an etching atmosphere. Thereby, side wall protection by deposits and etching proceed alternately, and side walls of each of the first to the third recesses 24b to 24d may become perpendicular to the upper surface of the base member 21.

Thereafter, the first resist pattern 29 is removed.

Figure 14:
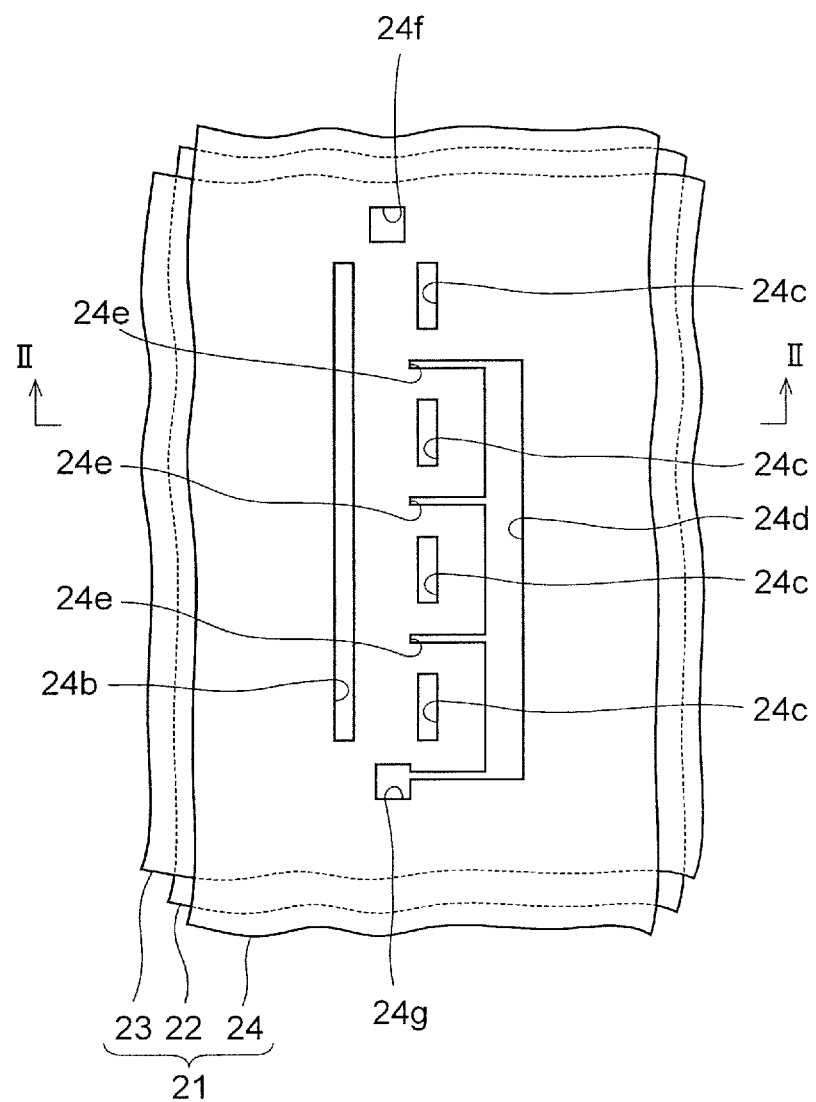
FIG. 14 is a plan view (Part 1) of the electronic device in the course of manufacture thereof according to the first embodiment.

FIG. 14 is a plan view after this step is ended. FIG. 13B described above corresponds to a cross-sectional view taken along the line II-II in FIG. 14.

As illustrated in FIG. 14, the etching in this step forms channels 24e and a fifth recess 24g communicating with the third recesses 24d as well as the fourth recess 24f.

Among them, the channels 24e correspond to the above-described terminals 28 (see FIG. 4), and the fifth recess 24g corresponds to the second end portion 34. Moreover, the fourth recess 24f corresponds to the first end portion 33.

Figure 13C:
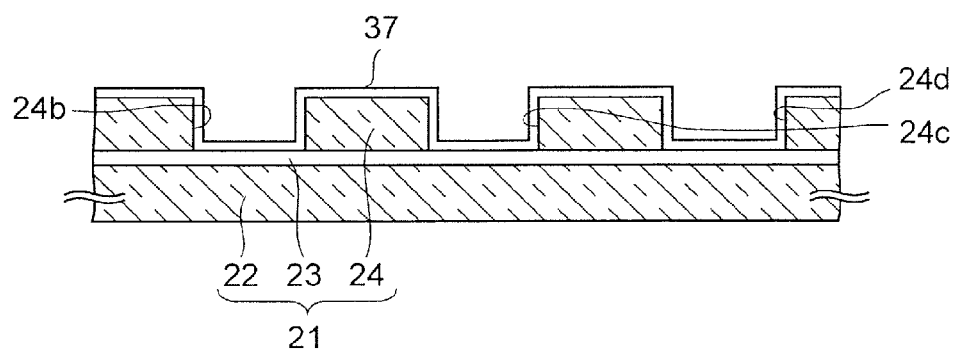

Next, as illustrated in FIG. 13C, the dielectric film 37 is formed to a thickness of approximately 100 nm to 500 nm on an inner surface of each of the first to the third recesses 24b to 24d and on upper surfaces of the silicon film 24 by a CVD process.

The material of the dielectric film 37 is not particularly limited. Nevertheless, a film having an etching selectivity to the silicon oxide film 23 is preferably formed as the dielectric film 37. In the present embodiment, a silicon nitride film is formed as the dielectric film 37.

Figure 13D:
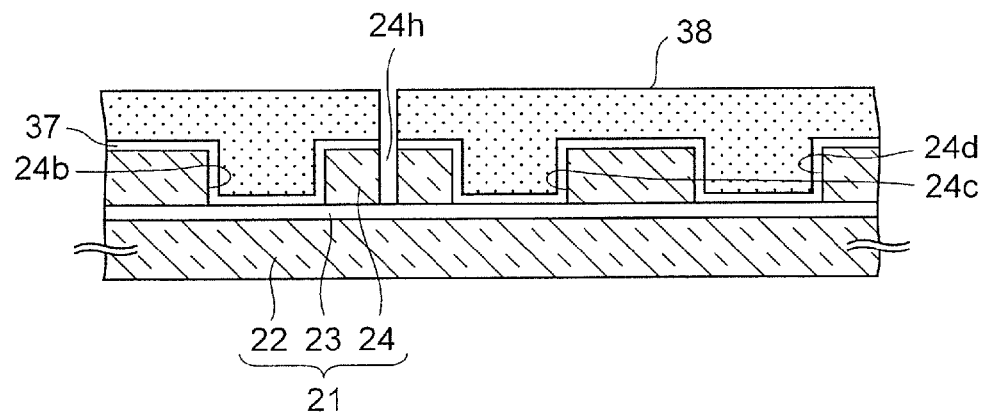

Subsequently, as illustrated in FIG. 13D, a photoresist is applied onto the dielectric film 37, which then undergoes exposure and development. Thereby, a second resist pattern 38 is formed.

After that, using the second resist pattern 38 as a mask, the dielectric film 37 and the silicon film 24 are dry-etched by RIE. Thereby, a slit 24h is formed in the silicon film 24.

The etching gas used in the dry etching is not particularly limited. As the etching gas for the silicon nitride film formed as the dielectric film 37, for example, a $C_2F_6$ gas or a gas mixture of a $C_4F_6$ gas and an $O_2$ gas may be used. On the other hand, the silicon film 24 is preferably etched by the aforementioned Deep-RIE, in which $SF_6$ and $C_4F_8$ are alternately supplied into an etching atmosphere.

Thereafter, the second resist pattern 38 is removed.

Figure 15:
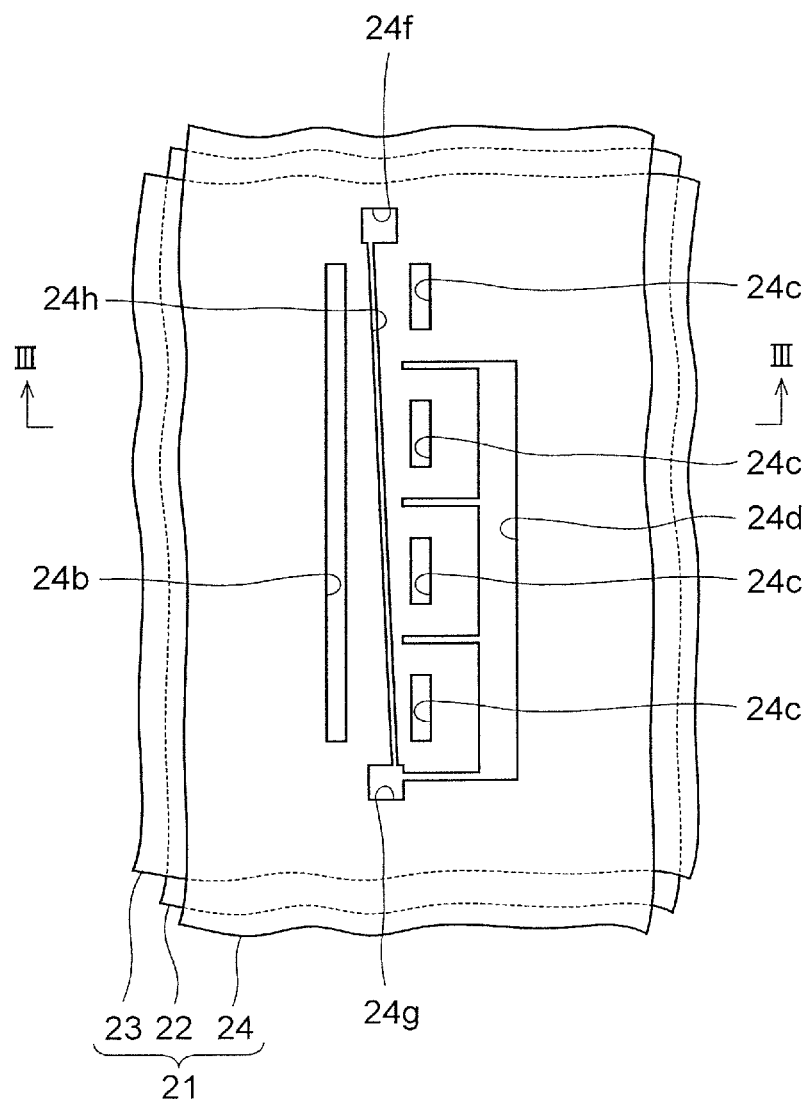
FIG. 15 is a plan view (Part 2) of the electronic device in the course of manufacture thereof according to the first embodiment.

FIG. 15 is a plan view after this step is ended. FIG. 13D described above corresponds to a cross-sectional view taken along the line in FIG. 15. Note that the dielectric film 37 is omitted in FIG. 15 and in FIGS. 16 and 17 to be described later.

As illustrated in FIG. 15, the slit 24h extends from the fourth recess 24f to the fifth recess 24g.

Figure 13E:
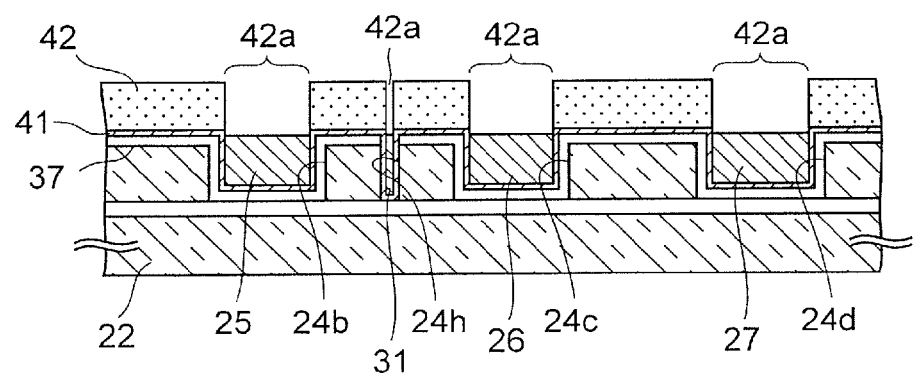

Next, description will be given of a step until a cross-sectional structure illustrated in FIG. 13E is obtained.

First, an adhesion film and a gold film are formed by sputtering in this order as a seed layer 41 on the dielectric film 37 and on an inner surface of the slit 24h. The material and thickness of the adhesion film are not particularly limited. In the present embodiment, a titanium film or a chromium film having a thickness of approximately 10 nm is formed as the adhesion film. Meanwhile, the gold film has a thickness of approximately around 100 nm.

Next, a third resist pattern 42 is formed on the seed layer 41. The third resist pattern 42 has a window 42a on each of the first to the third recesses 24b to 24d and the slit 24h.

Subsequently, by using the seed layer 41 as a power supply layer, a metal film such as a gold film is grown in the window 42a by electroplating. The gold film is buried in each of the first to the third recesses 24b to 24d and the slit 24h.

In this manner, the gold film buried in the first recess 24b serves as the first driving electrode 25, and the gold film buried in the second recess 24c serves as the second driving electrode 26. Further, the gold film buried in the slit 24h serves as the conductive film 31, the gold film buried in the third recesses 24d serves as the conductive pattern 27.

Note that the metal film formed by electroplating in this step is not limited to the gold film described above, and a metal film having a low resistance and easily undergoing the plating, for example, a copper film, may be formed.

Thereafter, the third resist pattern 42 is removed.

Figure 16:
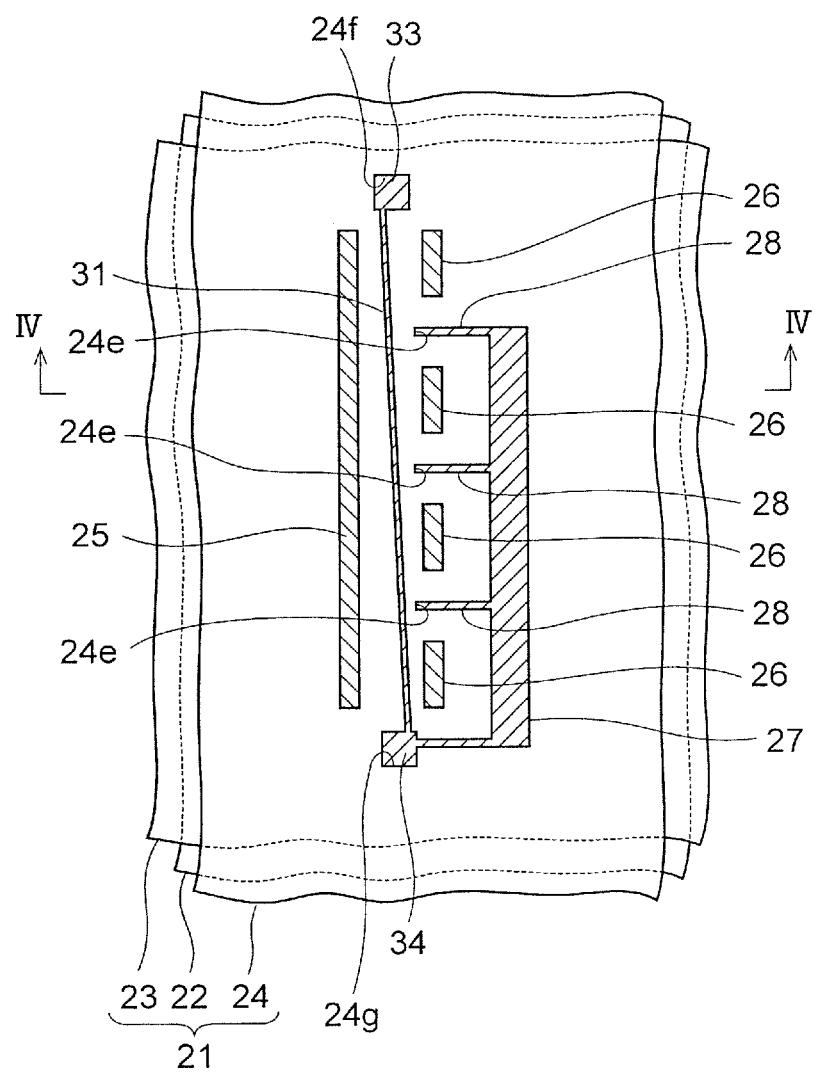
FIG. 16 is a plan view (Part 3) of the electronic device in the course of manufacture thereof according to the first embodiment.

FIG. 16 is a plan view after this step is ended. FIG. 13E described above corresponds to a cross-sectional view taken along the line IV-IV in FIG. 16.

As illustrated in FIG. 16, in this step, the above-described gold film is buried also in the fourth recess 24f and the fifth recess 24g. Thereby, the first end portion 33 and the second end portion 34 of the conductive film 31 are formed. Further, the gold film is buried in each of the plurality of channels 24e to form the plurality of terminals 28.

Figure 13F:
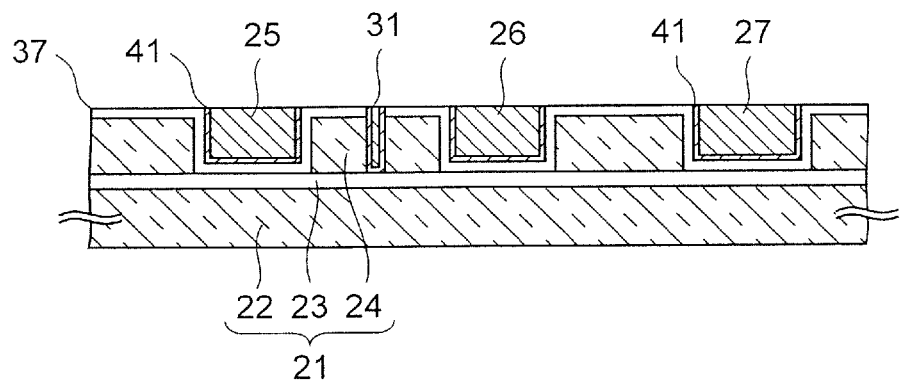

Subsequently, as illustrated in FIG. 13F, by ion milling using an argon gas, portions of the seed layer 41 formed on the upper surfaces of the dielectric film 37 are removed.

Figure 13G:
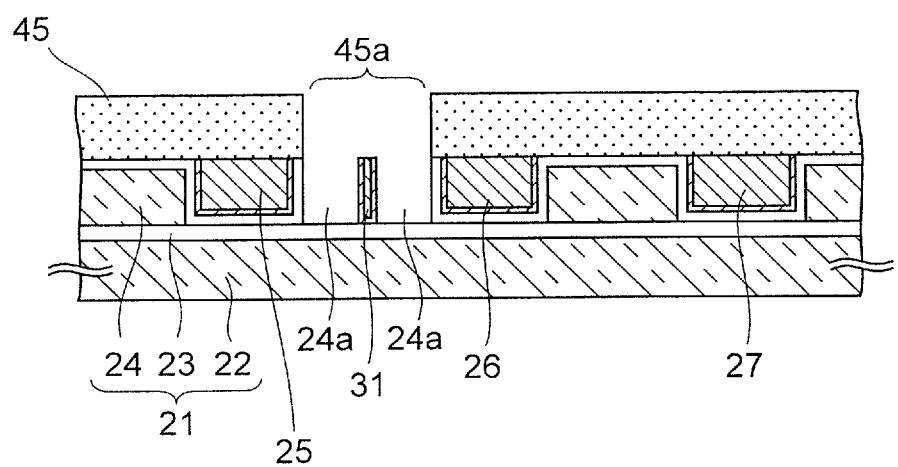

Next, as illustrated in FIG. 13G, a photoresist is applied to the entire upper surface of the base member 21, which then undergoes exposure and development. Thereby, a fourth resist pattern 45 including a window 45a superimposed over the conductive film 31 is formed.

Subsequently, using the fourth resist pattern 45 as a mask, the dielectric film 37 and the silicon film 24 adjacent to the conductive film 31 are removed by dry etching. Thereby, the groove 24a is formed in the base member 21.

The etching gas used in the dry etching is not particularly limited. As the etching gas for the silicon nitride film formed as the dielectric film 37, for example, a $C_2F_6$ gas or a gas mixture of a $C_4F_6$ gas and an $O_2$ gas may be used. On the other hand, the silicon film 24 is preferably etched by the aforementioned Deep-RIE, in which $SF_6$ and $C_4F_8$ are alternately supplied into an etching atmosphere.

Thereafter, the fourth resist pattern 45 is removed.

Figure 17:
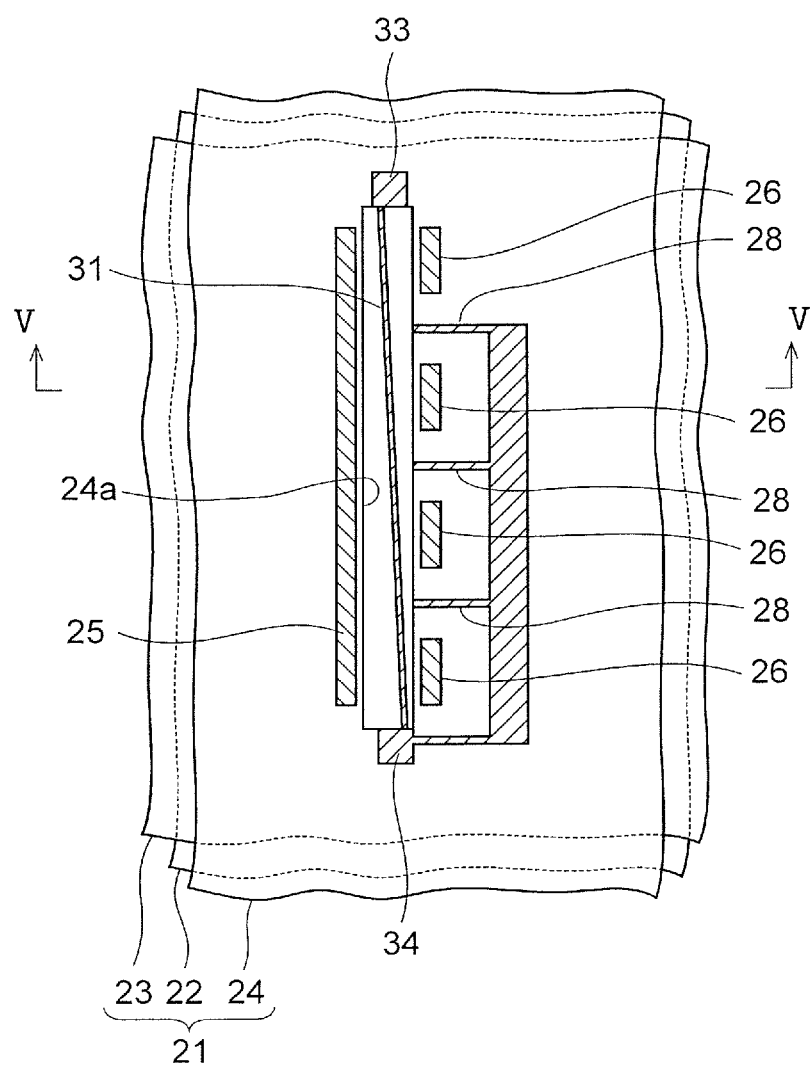
FIG. 17 is a plan view (Part 4) of the electronic device in the course of manufacture thereof according to the first embodiment.

FIG. 17 is a plan view after this step is ended. FIG. 13G described above corresponds to a cross-sectional view taken along the line V-V in FIG. 17.

As illustrated in FIG. 17, the groove 24a has a rectangular shape long in a direction in which the conductive film 31 extends in a plan view of the groove 24a.

Figure 13H:
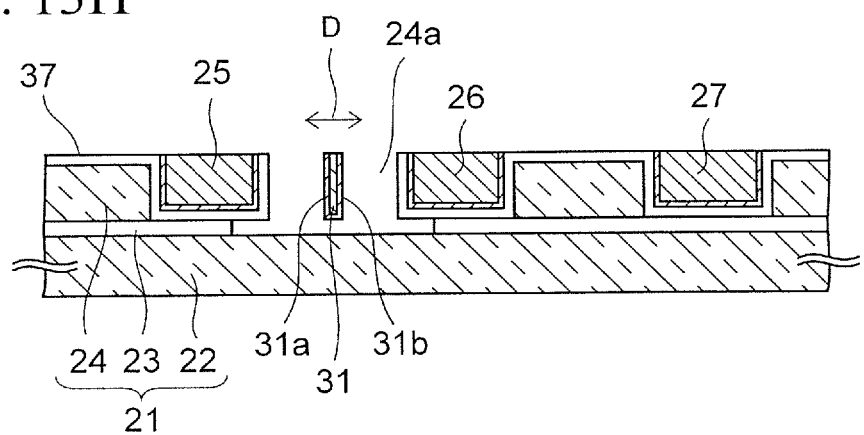

Next, as illustrated in FIG. 13H, hydrofluoric acid vapor is supplied to the silicon oxide film 23 through the groove 24a. Thereby, the silicon oxide film 23 under the groove 24a and the conductive film 31 is isotropically etched and removed. This makes the conductive film 31 free from the restraint of the silicon oxide film 23 and movable in the lateral direction D of the base member 21.

As a result, the first main surface 31a of the conductive film 31 may approach to the first driving electrode 25, or the second main surface 31b may approach to the second driving electrodes 26.

Incidentally, the etching gas used in this step is not limited to hydrofluoric acid vapor. The silicon oxide film 23 may be etched and removed with, for example, a gas mixture of a $C_4F_8$ gas and an $O_2$ gas. The silicon nitride film formed as the dielectric film 37 has etching resistant to these etching gases. For this reason, the dielectric film 37 is allowed to remain on the side surfaces of the first driving electrode 25 and the second driving electrodes 26 after this step is ended so that the conductive film 31 now movable in the lateral direction D may be prevented from being electrically short-circuited with the first driving electrode 25 or the second driving electrodes 26.

Thereafter, a gold film is formed on the entire upper surface of the base member 21. The gold film is patterned by the lift-off process to form the first electrode pad 35 and the second electrode pad 36 (see FIG. 4).

From the foregoing, the basic structure of the electronic device 20 according to the present embodiment is completed.

(Second Embodiment)

Figure 18:
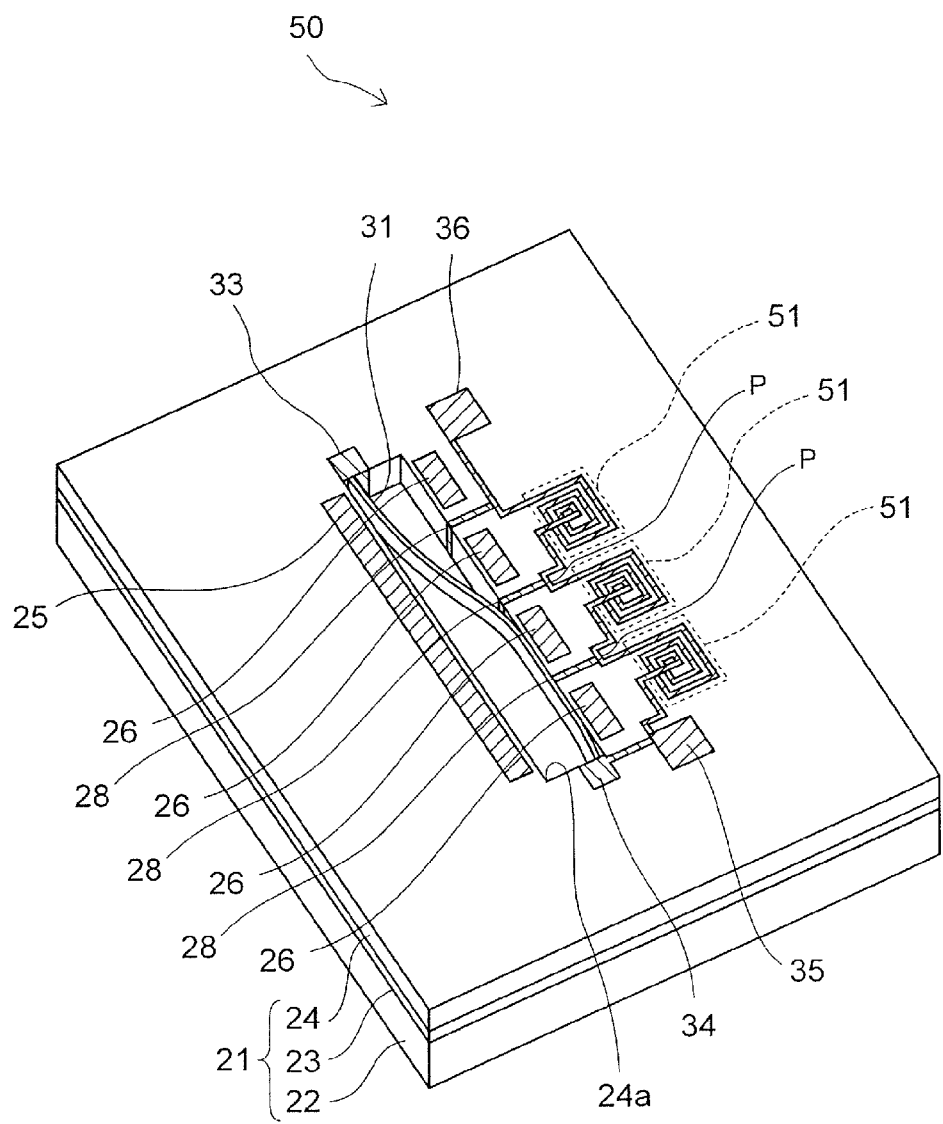
FIG. 18 is a perspective view of an electronic device according to a second embodiment.

FIG. 18 is a perspective view of an electronic device 50 according to the present embodiment. Note that, in FIG. 18, the same reference signs as those in the first embodiment denote the same elements as those described in the first embodiment, and the description will be omitted hereinafter.

As illustrated in FIG. 18, in the present embodiment, a plurality of spiral-shaped coils 51 connected to each other in series are provided in place of the conductive pattern 27 described in the first embodiment (see FIG. 4).

These coils 51 may have the same inductance, or the coils 51 may have different inductances from each other.

Moreover, to a connection point P between corresponding two of the coils 51, each of the plurality of terminals 28 is electrically connected. Further, the first electrode pad 35 and the second electrode pad 36 are electrically connected to the respective ends of the plurality of coils 51.

Next, a method of driving the electronic device 50 will be described with reference to FIGS. 19A, 19B, 20A, 20B, 21A, 21B, 22A and 22B. Note that, in FIGS. 19A, 19B, 20A, 20B, 21A, 21B, 22A and 22B, the same reference signs as those in the first embodiment denote the same elements as those described in the first embodiment, and the description will be omitted hereinafter.

Additionally, hereinbelow, the driver IC 40 described in the first embodiment (FIG. 6) is used to supply the electronic device 50 with the first driving voltage $V_1$, the second driving voltage $V_2$, and the reference voltage $V_0$.

Figure 19A:
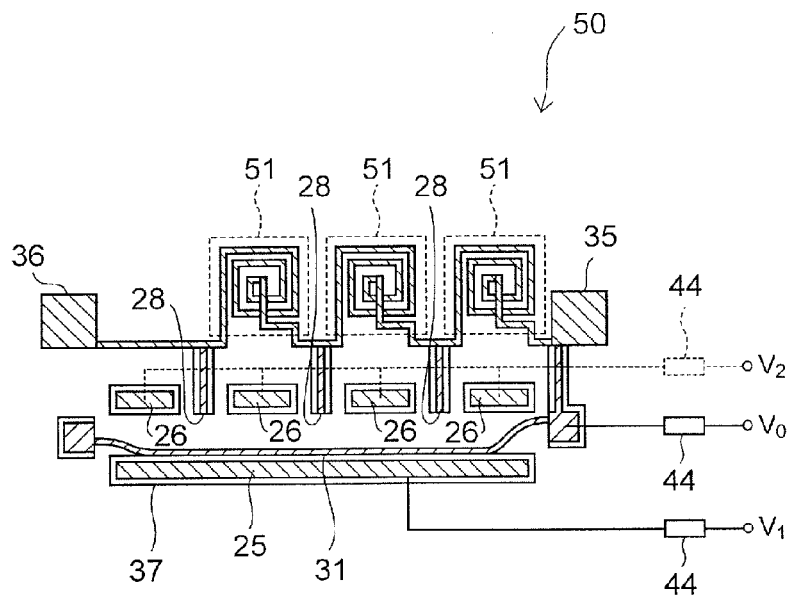
FIG. 19A is a schematic view (Part 1) of the electronic device according to the second embodiment.
Figure 19B:
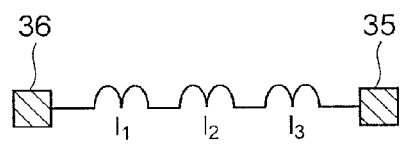
FIG. 19B is an equivalent circuit diagram thereof.

FIG. 19A is a schematic view (Part 1) of the electronic device 50, and FIG. 19B is an equivalent circuit diagram thereof.

FIG. 19A illustrates a state where the conductive film 31 is attracted to the first driving electrode 25 by the first driving voltage $V_1$. Note that, in this example, the second driving voltage $V_2$ is applied to none of the plurality of second driving electrodes 26, and the potential of the second driving electrodes 26 is the same as the potential of the conductive film 31.

In this case, since the conductive film 31 is separated from all of the terminals 28, the conductive film 31 bypasses none of the plurality of coils 51.

Accordingly, as illustrated in FIG. 19B, the coils 51 in this case have a combined inductance of $l_1+l_2+l_3$ where $l_1$, $l_2$, and $l_3$ are the inductances of the coils 51 in the order closest to the second electrode pad 36.

Figure 20A:
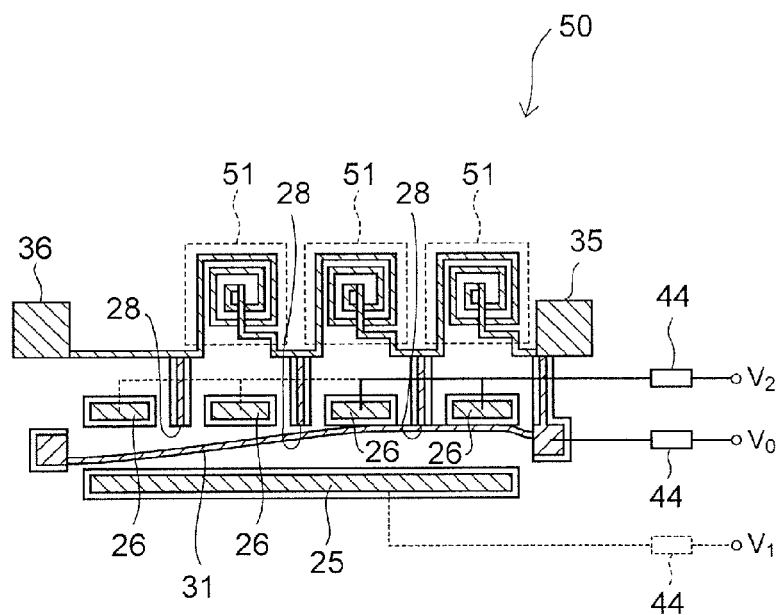
FIG. 20A is a schematic view (Part 2) of the electronic device according to the second embodiment.
Figure 20B:
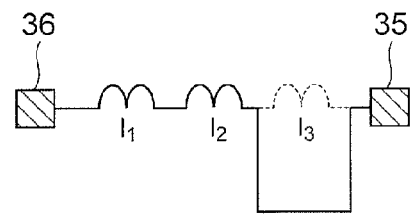
FIG. 20B is an equivalent circuit diagram thereof.

FIG. 20A is a schematic view (Part 2) of the electronic device 50, and FIG. 20B is an equivalent circuit diagram thereof.

In this case, the second driving voltage $V_2$ is applied to the two second driving electrodes 26 close to the first electrode pad 35, and the conductive film 31 is brought into contact with the terminal 28 between these second driving electrodes 26.

Note that the first driving voltage $V_1$ is not applied to the first driving electrode 25, and the first driving electrode 25 has the same potential as the conductive film 31. This is the same for FIGS. 21A, 21B, 22A and 22B to be described later.

In this manner, the conductive film 31 bypasses the coil 51 close to the first electrode pad 35. Additionally, the inductance component of the conductive film 31 is small enough to be ignored in comparison with the inductances of the spiral-shaped coils 51.

Hence, as illustrated in FIG. 20B, the inductance $l_3$ of the coil 51 thus bypassed is eliminated between the first electrode pad 35 and the second electrode pad 36, so that the combined inductance of the coils 51 is $l_1+l_2$.

Figure 21A:
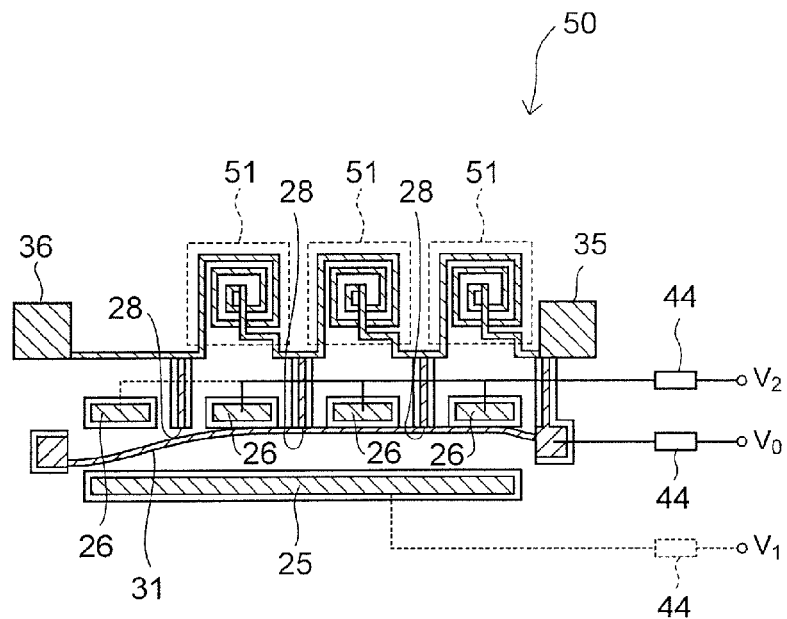
FIG. 21A is a schematic view (Part 3) of the electronic device according to the second embodiment.
Figure 21B:
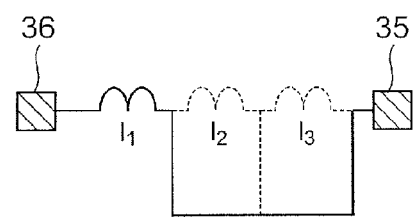
FIG. 21B is an equivalent circuit diagram thereof.

FIG. 21A is a schematic view (Part 3) of the electronic device 50, and FIG. 21B is an equivalent circuit diagram thereof.

In this case, the second driving voltage $V_2$ is applied to the three second driving electrodes 26 close to the first electrode pad 35, and the conductive film 31 is brought into contact with the terminals 28 between corresponding two of these second driving electrodes 26.

In this manner, the two coils 51 close to the first electrode pad 35 are bypassed by the conductive film 31.

Accordingly, as illustrated in FIG. 21B, the inductances $l_2$ and $l_3$ of the two coils 51 thus bypassed are eliminated between the first electrode pad 35 and the second electrode pad 36, so that the combined inductance of the coils 51 is $l_1$.

Figure 22A:
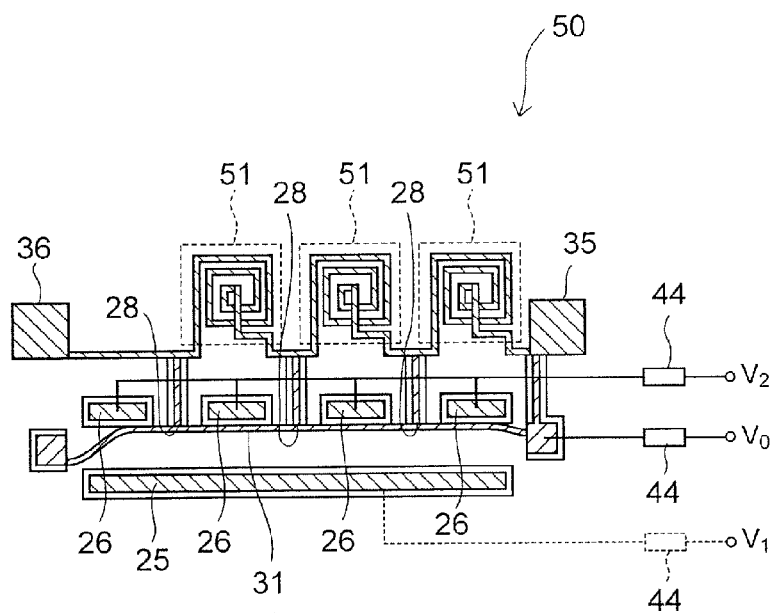
FIG. 22A is a schematic view (Part 4) of the electronic device according to the second embodiment.
Figure 22B:
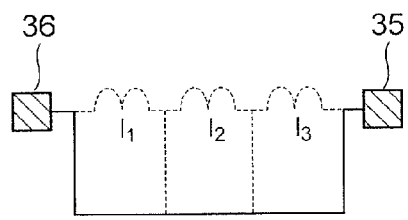
FIG. 22B is an equivalent circuit diagram thereof.

FIG. 22A is a schematic view (Part 4) of the electronic device 50, and FIG. 22B is an equivalent circuit diagram thereof.

In this case, the second driving voltage $V_2$ is applied to all of the second driving electrodes 26, and thereby the conductive film 31 is brought into contact with all of the terminals 28, and all of the coils 51 are bypassed by the conductive film 31.

As a result, as illustrated in FIG. 22B, all the inductance $l_1$, $l_2$, and $l_3$ of the coils 51 are eliminated between the first electrode pad 35 and the second electrode pad 36, so that the combined inductance of the coils 51 is substantially 0.

As described above, the electronic device 50 according to the present embodiment may enable stepwise adjustment of inductances in a circuit, by selecting which one or more of the plurality of second driving electrodes 26 the second driving voltage $V_2$ is applied to. Thus, the electronic device 50 may be used as a variable inductor.

Further, since the inductances of the spiral-shaped coils 51 are sufficiently larger than that of the conductive film 31, the adjustment may be made in a larger range than that in a case where the inductance components of the conductive film 31 itself are utilized to adjust the inductances of the circuit as in the first embodiment.

Furthermore, in a case as illustrated in FIG. 19A where all of the coils 51 are not bypassed by the conductive film 31, the conductive film 31 is forced to be attracted to the first driving electrode 25 side by the first driving voltage $V_1$. This may make it possible to prevent the conductive film 31 from staying attached to the terminals 28.

Note that the use of the electronic device 50 is not particularly limited. As described in FIG. 12 in the first embodiment, the electronic device 50 is suitably used for achieving the impedance matching between the first high-frequency unit 46 and the second high-frequency unit 47.

Next, description will be given of a method of manufacturing the electronic device 50.

FIGS. 23A to 23E are cross-sectional views of the electronic device in the course of manufacture thereof according to the present embodiment, and FIGS. 24 to 27 are plan views thereof. Note that, in FIGS. 23A to 23E, 24, 25, 26 and 27, the same reference signs as those in the first embodiment denote the same elements as those described in the first embodiment, and the description will be omitted hereinafter.

Figure 23A:
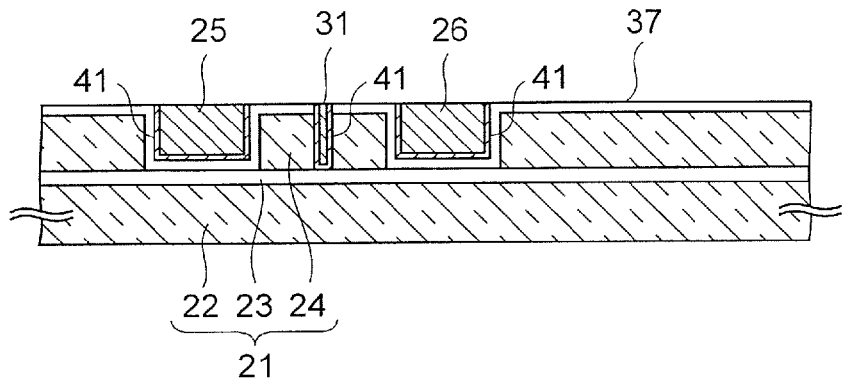
FIGS. 23A to 23E are cross-sectional views of the electronic device in the course of manufacture thereof according to the second embodiment.

In order to manufacture this electronic device 50, a cross-sectional structure illustrated in FIG. 23A is obtained by performing the steps in FIGS. 13A to 13F described in the first embodiment. It should be noted that, in the present embodiment, the conductive pattern 27 formed in the first embodiment is not formed.

Figure 23B:
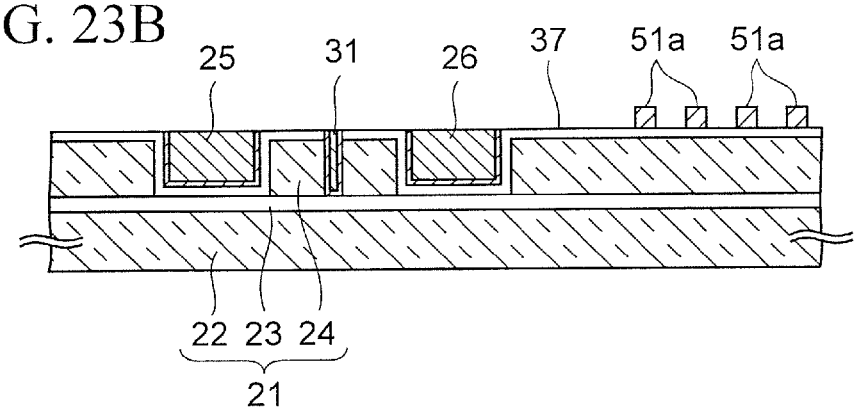

Next, as illustrated in FIG. 23B, an electroplated gold film is patterned by the lift-off process on the dielectric film 37 adjacent to the second driving electrode 26 to form lower wires 51a of the coils 51.

Figure 24:
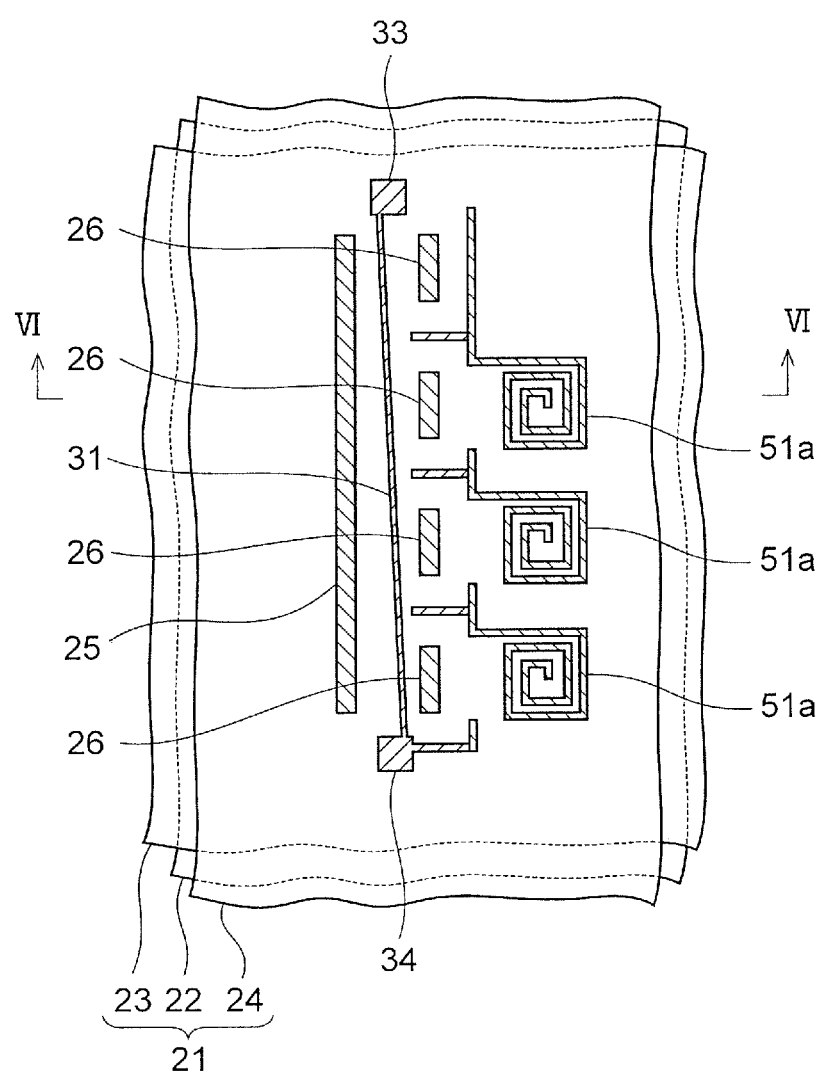
FIG. 24 is a plan view (Part 1) of the electronic device in the course of manufacture thereof according to the second embodiment.

FIG. 24 is a plan view after this step is ended. FIG. 23B described above corresponds to a cross-sectional view taken along the line VI-VI in FIG. 24.

As illustrated in FIG. 24, the lower wires 51a each have a spiral shape in a plan view thereof.

Figure 23C:
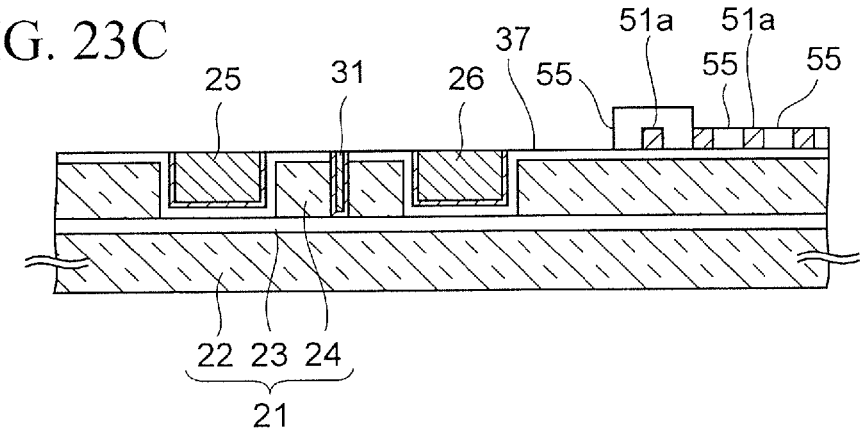

Subsequently, as illustrated in FIG. 23C, a silicon oxide film is formed as an insulating film 55 on the entire upper surface of the base member 21 by a CVD process. Then, the insulating film 55 is patterned in such a manner that the insulating film 55 remains on and around the lower wires 51a.

Thereafter, the insulating film 55 is patterned again in such a manner that the insulating film 55 remains on the lower wire 51a close to the second driving electrode 26 but the insulating film 55 on the other lower wires 51a is removed.

Figure 23D:
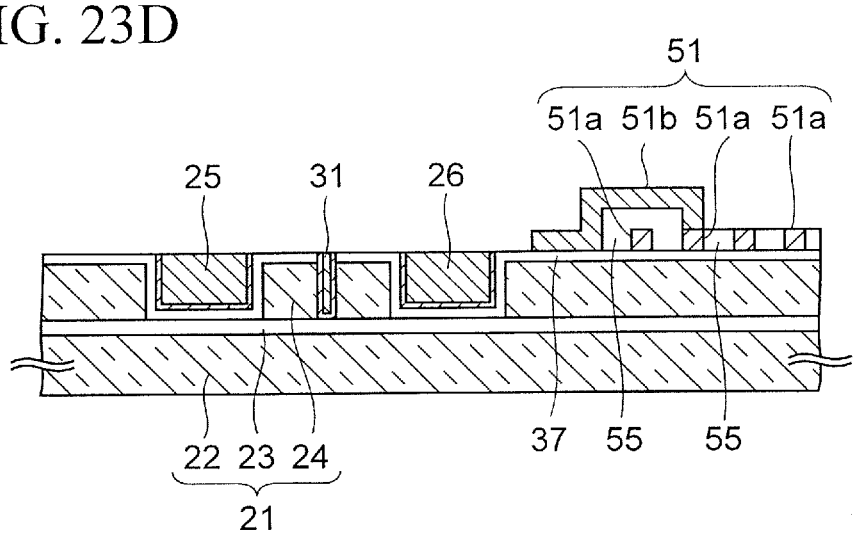

After that, as illustrated in FIG. 23D, a gold film is formed on the lower wires 51a and the insulating film 55 by electroplating. The gold film is patterned by the lift-off process to form an upper wire 51b of the coil 51, the upper wire 51b connected to the lower wire 51a.

Figure 25:
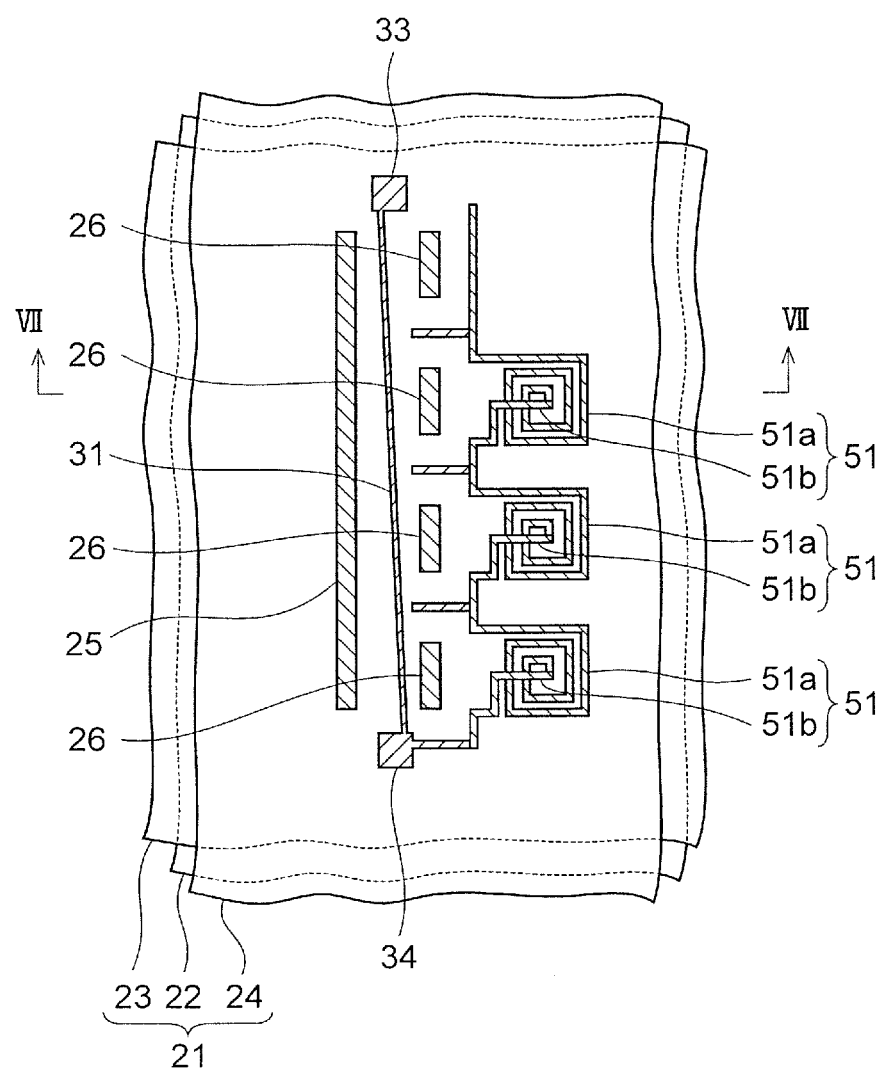
FIG. 25 is a plan view (Part 2) of the electronic device in the course of manufacture thereof according to the second embodiment.

FIG. 25 is a plan view after this step is ended. FIG. 23D described above corresponds to a cross-sectional view taken along the line VII-VII in FIG. 25. Note that, in FIG. 25, the dielectric film 37 and the insulating film 55 are omitted.

Figure 23E:
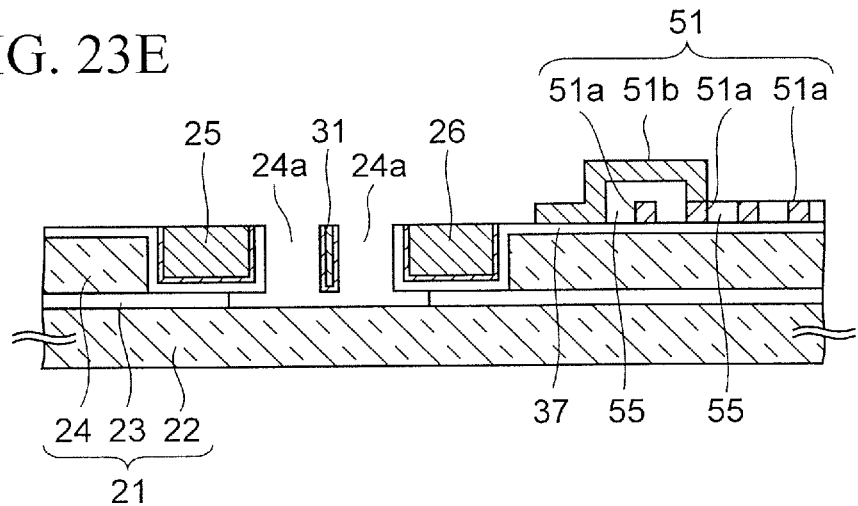

Thereafter, by performing the steps of FIGS. 13G and 13H described in the first embodiment, the grooves 24a are formed in both main surface sides of the conductive film 31 as illustrated in FIG. 23E. This makes the conductive film 31 movable in the lateral direction of the base member 21.

Figure 26:
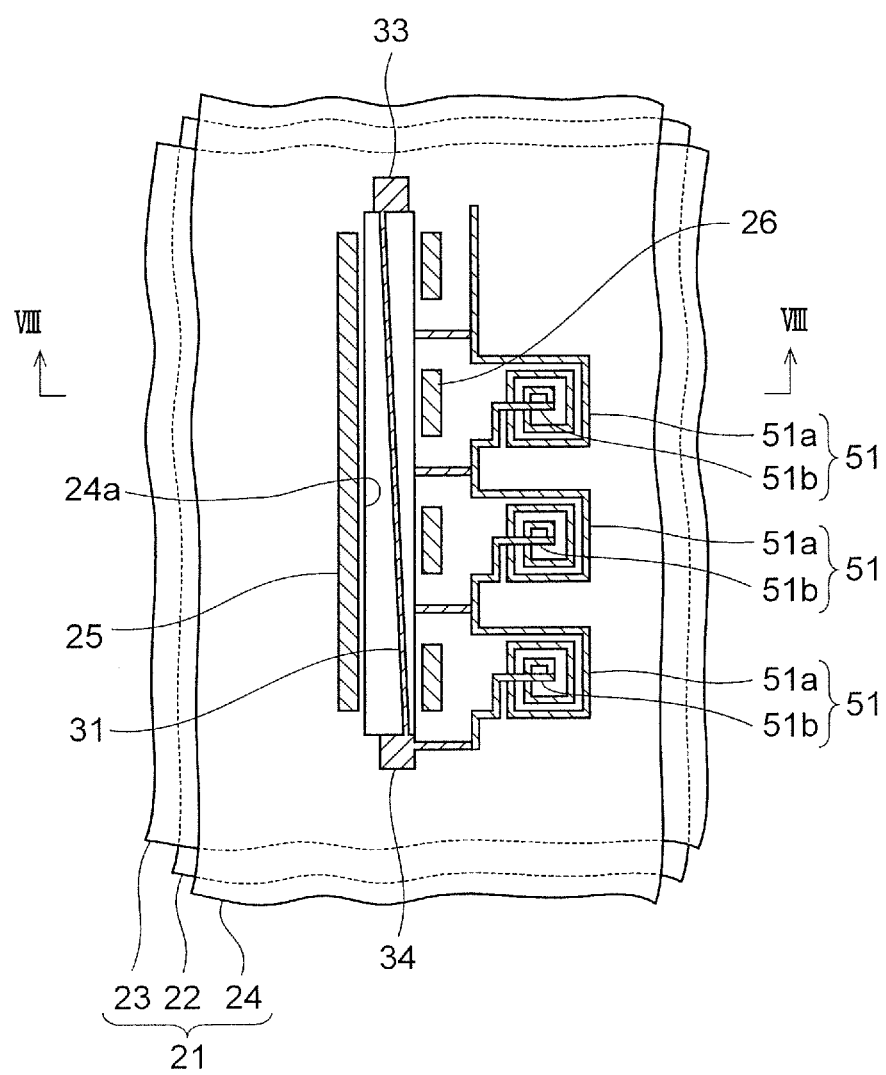
FIG. 26 is a plan view (Part 3) of the electronic device in the course of manufacture thereof according to the second embodiment.

FIG. 26 is a plan view after this step is ended. FIG. 23E described above corresponds to a cross-sectional view taken along the line VIII-VIII in FIG. 26. Note that, in FIG. 26, the dielectric film 37 and the insulating film 55 are omitted.

Figure 27:
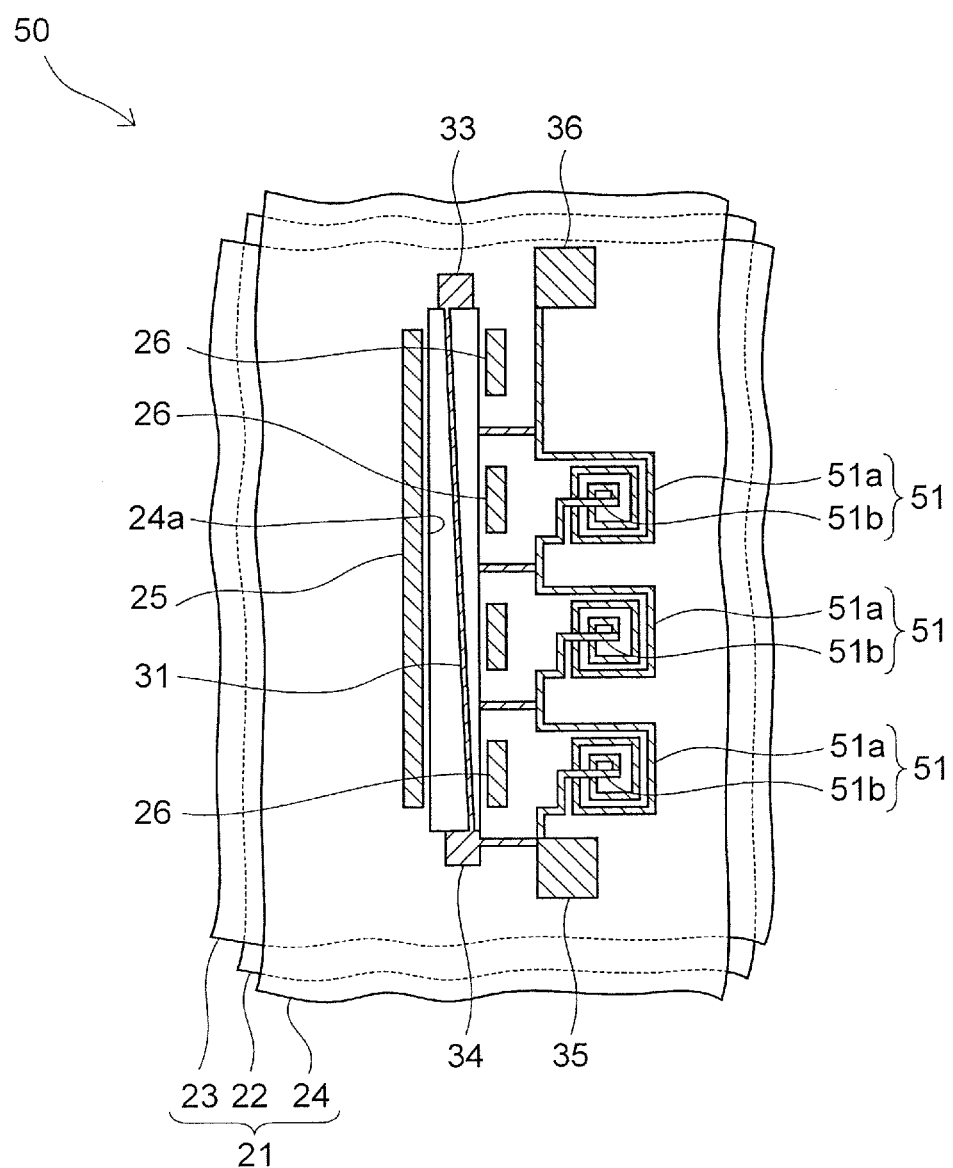
FIG. 27 is a plan view (Part 4) of the electronic device in the course of manufacture thereof according to the second embodiment.

Thereafter, as illustrated in FIG. 27, the first electrode pad 35 and the second electrode pad 36 obtained by patterning a plated gold film by the lift-off process are formed on the base member 21.

From the foregoing, the basic structure of the electronic device 50 according to the present embodiment is completed.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising:
   a base member;
   a conductive film including a first end portion and a second end portion fixed to the base member, the conductive film being movable in a lateral direction of the base member between the first end portion and the second end portion;
   a first driving electrode provided in the base member at a position opposed to a first main surface of the conductive film, wherein a first driving voltage is applied to the first driving electrode;
   a second driving electrode provided in the base member at a position opposed to a second main surface of the conductive film, wherein a second driving voltage is applied to the second driving electrode; and
   a terminal provided in the base member at a position where the terminal enables to come into contact with the second main surface of the conductive film, wherein
   a plurality of the second driving electrodes and a plurality of the terminals are provided, and
   one of the plurality of the terminals is provided between every adjacent two of the plurality of the second driving electrodes.

2. The electronic device according to claim 1, wherein the base member is provided with a conductive pattern electrically connected to the plurality of the terminals.

3. The electronic device according to claim 1, further comprising:
   a plurality of coils connected to each other in series, wherein
   each of the plurality of the terminals is electrically connected to a connection point between corresponding two of the plurality of coils.

4. The electronic device according to claim 3, wherein the plurality of coils each have a spiral shape in a plan view thereof.

5. The electronic device according to claim 1, further comprising:
   a voltage supply unit configured to supply the first driving electrode with the first driving voltage, and selectively supply the plurality of the second driving electrodes with the second driving voltage.

6. The electronic device according to claim 5, wherein RF (Radio Frequency) blocks are provided between the first driving electrode and the voltage supply unit, and between the plurality of the second driving electrodes and the voltage supply unit.

7. The electronic device according to claim 1, further comprising:
   a dielectric film covering a side periphery of each of the first driving electrode and the second driving electrode.

8. The electronic device according to claim 1, wherein a groove having a rectangular shape in a plan view thereof is formed in the base member, and
the conductive film is provided inside the groove in such a manner as to extend in a longitudinal direction of the groove.

9. The electronic device according to claim 8, wherein the first driving electrode is provided apart from the groove.

10. The electronic device according to claim 8, wherein the second driving electrode is provided apart from the groove.

11. The electronic device according to claim 8, wherein the terminal is exposed on a side surface of the groove.

12. A method of manufacturing an electronic device, the method comprising:
forming a conductive film including a first end portion and a second end portion fixed to a base member, the conductive film being movable in a lateral direction of the base member between the first end portion and the second end portion;
forming a first driving electrode in the base member at a position opposed to a first main surface of the conductive film, wherein a first driving voltage is applied to the first driving electrode;
forming a second driving electrode in the base member at a position opposed to a second main surface of the conductive film, wherein a second driving voltage is applied to the second driving electrode; and
forming a terminal in the base member at a position where the terminal enables to come into contact with the second main surface of the conductive film, wherein
in the forming of the second driving electrode, a plurality of the second driving electrodes are formed in the base member, and
in the forming of the terminal, a plurality of the terminals are formed in the base member, and one of the plurality of the terminals is formed between every adjacent two of the plurality of the second driving electrodes.

13. The method of manufacturing an electronic device according to claim 12, the method further comprising:
forming a first recess and a second recess apart from each other in a silicon film of an SOI (Silicon On Insulator) substrate obtained by sequentially forming a silicon oxide film and the silicon film on a silicon substrate;
forming a slit in the silicon film between the first recess and the second recess; and
burying a metal film in each of the first recess, the second recess, and the slit, wherein
the forming the first driving electrode is performed by forming, as the first driving electrode, a portion of the metal film buried in the first recess,
the forming the second driving electrode is performed by forming, as the second driving electrode, a portion of the metal film buried in the second recess, and
the forming the conductive film is performed by forming, as the conductive film, a portion of the metal film buried in the slit.

14. The method of manufacturing an electronic device according to claim 13, the method further comprising:
removing the silicon film adjacent to the conductive film to thereby form a groove in the base member; and
removing the silicon oxide film under each of the groove and the conductive film to thereby make the conductive film movable in the lateral direction of the base member.

15. A method of driving an electronic device, the device including:
a base member;
a conductive film including a first end portion and a second end portion fixed to the base member, the conductive film being movable in a lateral direction of the base member between the first end portion and the second end portion;
a first driving electrode provided in the base member at a position opposed to a first main surface of the conductive film;
a second driving electrode provided in the base member at a position opposed to a second main surface of the conductive film; and
a terminal provided in the base member at a position where the terminal enables to come into contact with the second main surface of the conductive film, wherein
a plurality of the second driving electrodes and a plurality of the terminals are provided, and
one of the plurality of the terminals is provided between every adjacent two of the plurality of the second driving electrodes, the method comprising:
applying a first driving voltage to the first driving electrode to attract the conductive film to the first driving electrode side and thereby separate the conductive film from the terminal; and
applying a second driving voltage to the second driving electrode to attract the conductive film to the second driving electrode side and thereby connect the terminal and the conductive film to each other.

16. The method of driving an electronic device according to claim 15, wherein
the second driving voltage is selectively applied to any of the plurality of the second driving electrodes, so that any of the plurality of the terminals is connected to the conductive film.

17. The method of driving an electronic device according to claim 16, wherein
the base member is provided with a conductive pattern electrically connected to the plurality of the terminals, and
an inductance between the first end portion and the second end portion is adjusted by connecting the conductive film to any of the plurality of the terminals through application of the second driving voltage and thereby by making the conductive pattern bypass a portion of the conductive film.

18. The method of driving an electronic device according to claim 16, wherein
a plurality of coils connected to each other in series are further provided, and each of the plurality of the terminals is electrically connected to a connection point between corresponding two of the plurality of coils, and
a combined inductance of the plurality of coils is adjusted by connecting the conductive film to any of the plurality of the terminals through application of the second driving voltage, and thereby by making the conductive film bypass any of the plurality of coils.

19. The method of driving an electronic device according to claim 15, wherein the first driving voltage and the second driving voltage are higher than a potential of the conductive film.

* * * * *